IMAGE

(12) United States Patent
Kawamura et al.

(10) Patent No.: US 7,774,666 B2
(45) Date of Patent: Aug. 10, 2010

(54) ANALYZER

(75) Inventors: Makoto Kawamura, Osaka (JP); Yutaka Ochi, Osaka (JP); Yasunaga Iseda, Osaka (JP); Hiroshi Yamaguchi, Nara (JP)

(73) Assignee: Panasonic Corporation, Osaka (JP)

( * ) Notice: Subject to any disclaimer, the term of this patent is extended or adjusted under 35 U.S.C. 154(b) by 388 days.

(21) Appl. No.: 11/866,595

(22) Filed: Oct. 3, 2007

(65) Prior Publication Data
US 2008/0086666 A1  Apr. 10, 2008

(30) Foreign Application Priority Data
Oct. 5, 2006  (JP) .............................. 2006-273964

(51) Int. Cl.
*G01R 31/28* (2006.01)
*G06F 11/00* (2006.01)
(52) U.S. Cl. .................. 714/729; 714/731; 714/798
(58) Field of Classification Search .................. None
See application file for complete search history.

(56) References Cited

U.S. PATENT DOCUMENTS 5,627,841 A * 5/1997 Nakamura .................. 714/731
7,036,060 B2 * 4/2006 Nakao et al. ................ 714/726
7,293,211 B2 * 11/2007 Kobayashi .................. 714/729
7,406,639 B2 * 7/2008 Clark ......................... 714/726
2006/0130014 A1   6/2006 Tanaka
2007/0233470 A1   10/2007 Goto et al.

FOREIGN PATENT DOCUMENTS

JP      2003 344502      12/2003

OTHER PUBLICATIONS

English language Abstract of JP 2003-344502.

* cited by examiner

*Primary Examiner*—Christine T Tu
(74) *Attorney, Agent, or Firm*—Greenblum & Bernstein, P.L.C.

(57) ABSTRACT

The analyzer according to the present invention is an analyzer having a scan test function, and including scan paths each having flip-flops which function as a shift register when a scan test is performed, and a switching unit operable to switch between a first connection state, and a second connection state where the scan paths are connected in series to each other and further an output from the last stage of the scan path is connected to the input of the first stage of the scan path.

23 Claims, 9 Drawing Sheets

ANALYZER

BACKGROUND OF THE INVENTION (1) Field of the Invention

The present invention relates to analyzers and in particular to an analyzer having a scan test function.

(2) Description of the Related Art

Known are methods using a scan path in order to facilitate a test in a semiconductor integrated circuit, in particular, a large scale logic circuit. Regarding a scan path composed of flip-flops (referred to simply as FFs hereinafter), the FFs function as a shift register when a scan test is performed, apart from ordinary logic used at the time of actual operation. This makes it possible to set predetermined values in the FFs inside the circuit from, for example, input terminals for test without being affected by the internal logic in the circuit, when the circuit is in a mode to operate a scan test (hereinafter referred to as scan mode). Moreover, values of the FFs inside the circuit can be outputted to output terminals for test.

However, with the conventional analyzer using a scan path that is incorporated in a semiconductor integrated circuit, it is difficult to continuously operate the circuit after data in FFs inside the circuit is read out and analyzed. To cope with this problem, known are methods of feeding back an output signal from a scan path to the input of the scan path (see, for example, Japanese Unexamined Patent Application Publication No. 2003-344502).

A conventional analyzer using a scan path, described in Japanese Unexamined Patent Application Publication No. 2003-344502, will be described hereinafter. FIG. 1 is a block diagram illustrating the configuration of the conventional analyzer.

The analyzer 900 illustrated in FIG. 1 has scan paths 901a and 901b, selectors 904a and 904b, and a dummy FF (flip-flop) 906.

The scan paths 901a and 901b are circuits for scan test, integrated into an actual operation circuit. The scan paths 901a and 901b operate as a shift register in the scan mode, and perform a shift operation in accordance with clocks 902. In the scan path 901b, the number of stages in the FFs therein is smaller than that of the FFs in the scan path 901a.

The dummy FF 906 is an FF that is not used in actual operation. The number of stages in the FFs in the scan path 901a is equal to the sum of that of the FFs in the scan path 901b and that of the dummy FF 906.

The selector 904a selects a scan path output 903a, which is an output from the scan path 901a, or a scan path input 905a, and then connects the selected one to the input of the scan path 901a. The selector 904b selects a scan path output 903b, which is an output from the scan path 901b, or a scan path input 905b, and then connects the selected one to the input of the scan path 901b.

In the scan mode, the selectors 904a and 904b select the scan path outputs 903a and 903b, respectively. The scan paths 901a and 901b each performs shift operation whenever one of the clocks 902 is inputted thereto, so that values of the FFs in the internal circuit (i.e., values of the FFs in the scan paths 901a and 901b) are sequentially outputted as the scan path outputs 903a and 903b, respectively. When the clocks 902 the number of which is equal to the number of stages in the FFs included in the scan path 901a are inputted to the analyzer, values of the FFs included in the scan paths 901a and 901b become the same values as those when the scan test starts (when the end of the actual operation mode). In this manner, it becomes possible to carry out actual operation continuously after the scan mode. Furthermore, providing the dummy FF 906 makes it possible that, although the analyzer has scan paths in which the numbers of stages in the FFs therein are different from each other, values of the FFs included in the scan paths are returned to the values when the scan test starts, by using the same number of clocks.

SUMMARY OF THE INVENTION

However, in the analyzer using conventional scan paths, there is a problem that the circuit size increases when the analyzer includes scan paths having different number of FFs because it is necessary to add FFs as dummy.

Thus, the object of the present invention is to provide an analyzer which can restore the values of the FFs to the values when the scan test starts, so as to prevent increase in circuit size.

In order to achieve the object above, the analyzer according to the present invention is an analyzer having a scan test function, including: scan paths, each including flip-flops which functions as a shift register when a scan test is performed; and a switching unit which switches between a first connection state, and a second connection state in which the scan paths are connected in series and an output from the scan path at the last stage is connected to an input of the scan path at the first stage.

According to this configuration, the plurality of scan paths can be connected in series by the switching unit, so that the scan paths can be handled as a large shift register. In addition, the scan paths form a feedback. As a result of this, in the state where data in all the FFs included in the scan paths are read out, the data in the FFs included in the scan paths become data when the scan test starts. Furthermore, it is unnecessary to add any dummy FF as in conventional analyzers; therefore, an increase in the circuit scale can be suppressed. Furthermore, even when the analyzer has scan paths, the individual scan paths can be connected to each other and the connected scan paths can be regarded as a large scan path, whereby the inputs and the outputs can be respectively unified. This makes it possible to decrease the number of paths for inputting and outputting data in and from the scan paths.

In addition, the switching unit may switch between the first connection state and the second connection state, the first connection state being a state in which to the input of each of the scan paths connected is a signal to be written in the scan path at the time of the scan test.

According to this configuration, at the time of the scan test, the switching unit can select data to be written in each of the scan paths, thereby writing the data in the FFs included in each of the scan paths. Furthermore, data read out by the scan test operation can again be written, thereby reproducing the state of the circuit any number of times when the data is read out.

In addition, the analyzer may further include a data converting unit which replaces predetermined data with the output from the scan path at the last stage, in which the switching unit switches between the first connection state and the second connection state, the second connection state being a state in which the scan paths are connected in series and the data replaced by the data converting unit is connected to the input of the scan path at the first stage.

According to this configuration, the data converting unit makes it possible to change the value of any one of the FFs on the data taken out from the scan path outputs. As a result of this, it can be observed what change is caused in the operation of specific one of the FFs, the state of the specific one being changed at the time of the analysis.

In addition, the data converting unit may includes a memory unit operable to store information for specifying each of the flip-flops included in the scan paths, and the data converting unit replaces data stored in the flip-flops included in the scan paths based on the information stored in the memory unit.

According to this configuration, based on signals generated in the inside or the outside, the data converting unit can write data in designated one of the FFs by use of information for specifying one of the FFs included in the scan paths, the specifying information being stored in the memory unit. As a result of this, in the case where, e.g., a failure of the circuit occurs at a particular spot, the failure of the circuit can be concealed by switching a specific operation automatically by interruption.

In addition, the analyzer may further include: a memory unit in which data used at the time of actual operation is stored; and a memory controlling unit which controls the operation of the memory unit independently of the scan operation of the scan paths at the time of the scan test.

According to this configuration, even when the actual operation is stopped to perform the scan test, the value stored in the memory unit can be held by the memory controlling unit. For example, when the memory unit includes a DRAM or the like, the memory controlling unit can hold data in the memory unit by performing refresh operation in the scan test. In this way, the memory unit can hold data when the scan test starts (i.e., when the actual operation ends) when the operation mode is shifted to the actual operation mode.

The analyzer may further include: a first memory unit in which data used at the time of actual operation is stored; and a second memory unit which stores the data stored by the first memory unit when the scan test starts.

According to this configuration, when the operation mode is shifted from the actual operation mode to the scan test mode and then values in the FFs in the scan paths are read and written, the data in the first memory unit used in the actual operation can be stored in the second memory unit and the data in the second memory unit can be returned into the first memory unit before returning to the actual operation. As a result thereof, even when the data held in the first memory unit is lost by the scan test operation, the first memory unit can hold the data when the scan test started when the operation mode is again shifted to the actual operation mode.

In addition, the scan paths may include a first scan path and a second scan path, the analyzer may include: a first functional block including the first scan path; and a second functional block including the second scan path, and operating asynchronously with the first functional block at the time of actual operation, the first functional block may include a data transmitting unit which transmits data to the second functional block, the second functional block may include a data receiving unit which generates an acknowledge signal for notifying the first functional block that the data is received when properly receives the data from the data transmitting unit, and the data receiving unit transmits the acknowledge signal to the first functional block when the operation mode performed by the analyzer is shifted to actual operation and the state of the second functional block turns into a data-receivable state.

According to this configuration, at the time of returning of the operation mode from the scan test mode to the actual operation mode, the data receiving unit in the second functional block transmits the acknowledge signal for notifying that the data receiving unit can receive data to the first functional block. When the data transmitting unit in the first functional block receives the acknowledge signal from the second functional block, the data transmitting unit can understand that the second functional block is in a data-receivable state. As a result of this, when the operation mode is returned from the scan test mode to the actual operation mode, the following can be prevented in the functional blocks having the asynchronous clock systems: the frequencies of the clocks falsely increase and decrease to disrupt the phase relationship between the blocks, thereby generating a malfunction (duplicate transmission of data or non-transmission of data).

In addition, the scan paths may include a first scan path and a second scan path, and the analyzer may further include: a first functional block including the first scan path, and operating in accordance with a first clock at the time of actual operation; a second functional block including the second scan path, and operating in accordance with a second clock that is asynchronous with the first clock at the time of the actual operation; a phase difference detecting unit which detects a phase difference between the first clock and the second clock when the actual operation is shifted to the scan test; a phase difference holding unit which holds the phase difference detected by the phase difference detecting unit; and a delay controlling unit which delays, when the operation mode performed by the analyzer is returned from the scan test to the actual operation, to at least one of the first clock and the second clock, thereby making the phase difference between the first clock and the second clock equal to the phase difference held by the phase difference holding unit.

According to this configuration, at the time of returning of the operation mode from the scan test mode to the actual operation mode, in the functional blocks having the asynchronous clock systems, the phases supplied to the individual functional blocks can be made to phases when the actual operation ends. As a result of this, the following can be prevented in the functional blocks having the asynchronous clock systems: when the operation mode is returned from the scan test mode to the actual operation mode, a malfunction (duplicate transmission of data or non-transmission of data) is generated.

In addition, the scan paths may include a first scan path and a second scan path, and the analyzer may further include: a first functional block including the first scan path and operating in accordance with a first clock at the time of actual operation; a second functional block including the second scan path and operating in accordance with a second clock that is asynchronous with the first clock at the time of the actual operation; a first selecting unit which selects the first clock or a third clock and supply the selected clock to the first functional block; and a second selecting unit which selects the second clock or a fourth clock that is synchronous with the third clock and supply the selected clock to the second functional block.

According to this configuration, at the time of returning of the operation mode from the scan test mode to the actual operation mode, in the functional blocks having the asynchronous clock systems, synchronous clocks can be supplied to the individual functional blocks. As a result of this, the following can be prevented in the functional blocks having the asynchronous clock systems: when the operation mode is returned from the scan test mode to the actual operation mode, a malfunction (duplicate transmission of data or non-transmission of data) is generated.

In addition, the analyzer may further includes: an oscillating unit which oscillates a clock used at the time of actual operation; and an oscillation controlling unit which stops the oscillation of the oscillating unit when the operation mode performed by the analyzer is shifted from the actual operation to the scan test.

According to this configuration, the oscillation of the oscillating unit is stopped when the actual operation is stopped, and the oscillating unit is again operated when the operation mode is again returned to the actual operation mode. This makes it possible to decrease the generation of noises due to the oscillation of the oscillating unit at the time of the scan test. Furthermore, the power consumption in the scan test can be reduced.

In addition, the analyzer may further includes: a clock controlling unit which waits for the stabilization of the oscillation of the oscillating unit and resume the supply of the clock used in the actual operation when the operation mode performed by the analyzer is returned from the scan test to the actual operation.

According to this configuration, the operation mode can be returned to the actual operation mode in accordance with stable clocks by waiting for the stabilization of the oscillation of the oscillating unit. Thus, the occurrence of malfunction can be prevented.

In addition, the analyzer may further includes: an external data acquiring unit which acquires data from an external device at the time of actual operation; and an external device controlling unit which stops the external device at the time of the scan test and resume the operation of the external device when the operation mode performed by the analyzer is returned from the scan test to the actual operation.

According to this configuration, the operation of the external device can be stopped when the actual operation is stopped to perform the scan test, and the operation of the external device is resumed when the operation mode is returned to the actual operation mode, thereby continuing normal operation when the operation mode is returned to the actual operation mode.

In addition, the analyzer may further includes: an image data outputting unit which outputs image data at the time of actual operation, and output the image data when the actual operation ends, as still image data, at the time of the scan test.

According to this configuration, in the scan test mode, an external display device displays an image when the actual operation ends on the basis of the image data outputted from the image data outputting unit. This makes it possible to avoid a problem that, in the case of conducting analysis while seeing images, the output of the image data is stopped, thereby stopping the synchronizing signal for the display so that no image is outputted.

In addition, the analyzer may further includes a synchronization controlling unit which resumes the actual operation in accordance with the timing based on a synchronizing signal for the image data outputting unit when the operation mode performed by the analyzer is returned from the scan test to the actual operation.

According to this configuration, the operation mode can be returned to the actual operation mode at the same display timing as when the accrual operation is stopped. This makes it possible to avoid a situation in which a lag is generated in the synchronization of images when the operation mode is returned from the scan test mode to the actual operation mode.

In addition, the scan paths are respectively formed in different functional blocks, and the analyzer further includes a mode switching unit which controls the scan test and actual operation in each of the scan paths independently.

According to this configuration, the scan paths operate independently of each other in the individual functional blocks. This makes it possible to stop the actual operation only in specific one of the functional blocks to perform the scan test. Moreover, it is possible to operate only the scan path having a specific function in the actual operation mode, thereby reading out data in the internal circuit.

In addition, the analyzer may further include a detecting unit which detects an internal failure at the time of actual operation and to output an interrupt signal for notifying the outside of the failure.

According to this configuration, the detecting unit outputs an interrupt signal to the outside of the analyzer when a target phenomenon such as an internal failure occurs. When the outputted interrupt signal is observed, a precise timing of the occurrence of the failure can be measured.

In addition, the analyzer may further include a mode switching unit which stops the actual operation in accordance with a signal from the outside and perform the scan test.

According to this configuration, based on the interrupt signal from the outside, the actual operation mode is stopped to shift the operation mode to the scan test mode. This makes it possible to stop the actual operation of the analyzer at the timing of occurrence of a failure in an externally-connected device or the like, thereby performing the scan test.

In addition, the analyzer may further include a selecting signal generating unit which generates a selecting signal for selecting a specific one out of the flip-flops, in which when each of the flip-flops is according to the selecting signal, the selected flip-flop outputs data held therein to the flip-flop at the stage immediately after the selected flip-flop by use of the scan path, and when each of the flip-flops is not according to the selecting signal, the unselected flip-flop outputs data outputted from the flip-flop at the stage immediately before the unselected flip-flop to the flip-flop at the stage immediately after the unselected flip-flop.

According to this configuration, a specific FF can be selected and data in the selected FF can be read out. Moreover, an increase in the circuit scale can be prevented by use of the scan paths.

In addition, the analyzer may further include: a determining unit which determines whether or not data outputted from one or more of the scan paths matches predetermined data at the time of actual operation; and a mode switching unit stops the actual operation and perform the scan test when the determining unit determines that the data matches the predetermined data.

According to this configuration, the operation mode can be shifted from the actual operation mode to the scan test mode in accordance with data held in specific one of the FFs. This makes it possible to stop the actual operation and conduct analysis at the timing at which the internal state turns into a predetermined state.

In addition, the selecting signal generated by the selecting signal generating unit may includes a first selecting signal and a second selecting signal, and each of the flip-flops is selected on the basis of the logical sum of the first selecting signal and the second selecting signal.

According to this configuration, a specific FF can be specified in accordance with the selecting signals in the actual operation mode, thereby specifying the FF with the smaller number of wirings.

In addition, an analyzer having a scan test function, may include: scan paths, each including flip-flops which function as a shift register when a scan test is performed, a switching unit which switches between a first connection state, and a second connection state in which an output from each of the scan paths is connected to the input of the scan path, and a clock controlling unit which supplies clocks to each of the scan paths, the clocks numbering as many as the number of stages in the flip-flops included in the scan path during an scan operation in which data in all of the flip-flops included in the scan paths at the time of the scan test is read out.

According to this configuration, the clock controlling unit outputs, to each of the scan paths, the clocks the number of which is equal to the number of stages in the FFs in the scan paths. As a result of this, in the state where data in all the FFs included in the scan paths are read out by the scan operation, the data in the FFs included in the scan paths become data when the scan test starts. Furthermore, it is unnecessary to add any dummy FF as in conventional analyzers; therefore, an increase in the circuit scale can be prevented.

In addition, the analyzer may further include a parallel-serial converting unit which converts outputs from the scan paths to a serial signal.

According to this configuration, outputs from the scan paths can be converted to serial signals. In this way, the number of terminals for outputting data can be decreased. For example, when the actual operation is stopped to perform the scan test, the number of terminals for reading out data may be small; therefore, data can be read out while many of all the terminals keep a terminal state in the actual operation mode.

In addition, the analyzer may further include a serial-parallel converting unit which converts a serial signal to parallel signals, in which the switching unit switches between the first connection state which is a first connection state in which the parallel signals converted by the serial-parallel converting unit are connected to the inputs of the scan paths, and the second connection state.

According to this configuration, the serial signal inputted from the outside are converted to parallel signals, and then the parallel signals are assigned to the inputs of each of the scan paths. In this way, the number of terminals used to input data into the scan paths can be decreased. For example, when the actual operation is stopped to perform the scan test, the number of terminals for writing data may be small; therefore, data can be written while many terminals keep a terminal state in the actual operation mode.

In addition, an analyzer may include: a first analyzing device; a second analyzing device having the same circuit configuration as the first analyzing device; and an activating unit which activates the first analyzing device and the second analyzing device at different timings; the mode switching unit in the second analyzing device stops the actual operation and perform the scan test in accordance with the interrupt signal outputted from the detecting unit in the first analyzing device.

According to this configuration, when a failure occurs in the first analyzing device, the actual operation of the second analyzing device is stopped by the aid of an interrupt signal from the first analyzing device, so that the operation mode is shifted to the scan test mode. Since the first and second analyzing devices have the same circuit configuration, the internal state of the second analyzing device, which starts to operate later than the first analyzing device, becomes a state before the failure occurs. In short, the state of the internal circuit before the occurrence of the failure can be analyzed by reading out data in the scan paths in the second analyzing device.

In addition, the activating unit may activate the first analyzing device and the second analyzing device at different timings by making the timing of releasing a reset signal for resetting the operation of the first analyzing device different from the timing of releasing a reset signal for resetting the operation of the second analyzing device.

According to this configuration, wiring for clocks and so on can be shared by making the timing of reset signals different for booting the individual analyzing devices. Thus, the number of the wirings can be reduced.

The present invention makes it possible to return values in the FFs to values when the scan test starts. Thus, an analyzer wherein an increase in the circuit scale is prevented can be provided.

Further Information about Technical Background to this Application

The disclosure of Japanese Patent Application No. 2006-273964 filed on Oct. 5, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

With reference to the attached drawings, embodiments of the analyzer according to the present invention are described in detail hereinafter.

First Embodiment

An analyzer according to a first embodiment of the present invention has a mode in which scan paths are connected in series in a scan test operation so as to form a single shift register. The analyzer also has a function of looping an output from the scan paths connected in series to the input of the shift register. With this configuration, even when the numbers of stages in the FFs in the scan paths are different from each other, data held in the FFs in the scan paths can, after predetermined clocks are inputted to the analyzer, be easily returned to a state when the scan test starts. Thus, after the scan operation, actual operation can be continuously carried out.

First, the configuration of the analyzer according to the first embodiment of the present invention is described hereinafter.

Figure 2:
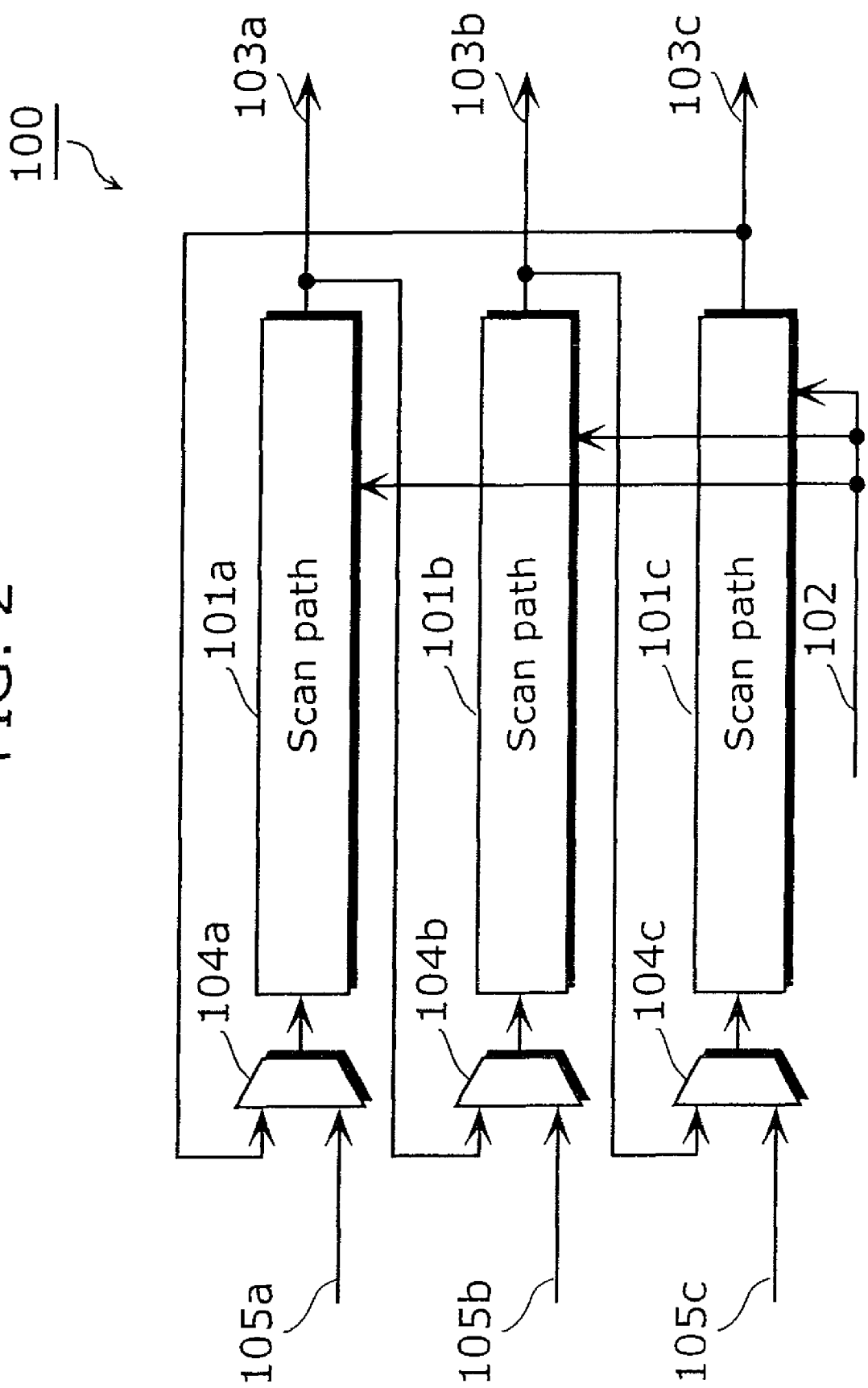
FIG. 2 shows a configuration of an analyzer according to a first embodiment of the present invention.

FIG. 2 is a block diagram illustrating the configuration of the analyzer according to the first embodiment.

The analyzer 100 illustrated in FIG. 2 is a circuit which is integrated into, for example, a semiconductor integrated circuit and has a scan function. The analyzer 100 includes scan paths 101a, 101b and 101c, and selectors 104a, 104b and 104c.

The scan paths 101a, 101b and 101c are scan test circuits integrated into an actual operation circuit, and each includes FFs. The FFs included in each of the scan paths 101a, 101b and 101c function as a shift register in a scan mode (in a mode in which scan test operation is performed). The scan path 101a performs a shift operation in accordance with clocks 102 in the scan mode to sequentially output data in the FFs included in the scan path 101a as a scan path output 103a. The scan path 101b performs a shift operation in accordance with the clocks 102 in the scan mode to sequentially output data in the FFs included in the scan path 101b as a scan path output 103b. The scan path 101c performs a shift operation in accordance with the clocks 102 in the scan mode to sequentially output data in the FFs included in the scan path 101c as a scan path output 103c.

The clocks 102 are clocks used for the shift operation of the scan paths 101a, 101b and 101c when a scan test is performed, and are inputted, for example, from the outside of a semiconductor device including the analyzer 100. The scan path outputs 103a, 103b and 103c are signals outputted to the outside of the semiconductor integrated circuit including the analyzer 100.

The selector 104a selects one of the scan path output 103c and a scan path input 105a, and connects the selected one to the input of the scan path 101a. The selector 101b selects one of the scan path output 103a and a scan path input 105b, and connects the selected one to the input of the scan path 101b. The selector 104c selects one of the scan path output 103b and a scan path input 105c, and connects the selected one to the input of the scan path 101c. To put it differently, the selectors 104a, 104b and 104c switch between the following first and second connection states: a first connection state where the scan path inputs 105a, 105b and 105c, which are signals respectively to be written in the scan paths 101a, 101b and 101c when a scan test is performed, are respectively connected to the inputs of the scan paths 101a, 101b and 101c; and a second connection state where the scan paths 101a, 101b and 101c are connected in series, and the scan path output 103c, which is an output from the scan path 101c of the last stage, is connected to the input of the scan path 101a of the first stage. The scan path inputs 105a, 105b and 105c are, for example, signals inputted from the outside of the semiconductor integrated circuit including the analyzer 100.

The operation of the analyzer 100 is described hereinafter.

An actual operation mode is a mode in which an ordinary operation of the semiconductor integrated circuit including the analyzer 100 is performed. In the actual operation mode, the FFs included in the scan paths 101a, 101b and 101c are connected to the circuit for actual operation, and operate as FFs in the actual operation circuit. In a scan mode, the FFs included in each of the scan paths 101a, 101b and 101c operate as a shift register. In the scan mode, the scan paths 101a, 101b and 101c perform shift operations through the clocks 102.

The scan mode includes a first scan mode and a second scan mode. In the first scan mode, the selectors 104a, 104b and 104c select the scan path inputs 105a, 105b and 105c, respectively. In this way, the scan path inputs 105a, 105b and 105c are sequentially shifted in the scan paths 101a, 101b and 101c, respectively, and then held in the FFs included in the scan paths 101a, 101b and 101c, respectively. Moreover, data held in the FFs included in the scan paths 101a, 101b and 101c are sequentially shifted in the scan paths 101a, 101b and 101c, respectively, and then outputted as the scan path outputs 103a, 103b and 103c, respectively. To put it differently, in the first scan mode, data from the outside can be set into the FFs included in the scan paths 101a, 101b and 101c. Moreover, when the scan mode starts (i.e., when the actual operation mode ends), data held in the FFs included in the scan paths 101a, 101b and 101c can be outputted to the outside.

In the second scan mode, the selectors 104a, 104b and 104c select the scan path outputs 103c, 103a and 103b, respectively. Thus, the output from the scan path 101a is connected to the input of the scan path 101b, the output from the scan path 101b is connected to the input of the scan path 101c, and the output from the scan path 101c is connected to the input of the scan path 101a. In this way, the scan paths 101a, 101b and 101c function as a single shift register so as to form a loop. In the second scan mode, the data in the FFs included in the scan paths 101a, 101b and 101c are sequentially outputted as the scan path output 103c when one of the clocks 102 is inputted to the analyzer. Specifically, when one of the clocks 102 is inputted to the analyzer, the data is sequentially outputted from the FF of the last stage in the scan path 101c up to the FF of the first stage in the scan path 101c. Next, the data in the FF of the last stage in the scan path 101b to the FF of the first stage in the scan path 101b are sequentially outputted. Then, the data in the FF of the last stage in the scan path 101a to the FF of the first stage in the scan path 101a are sequentially outputted.

As is described above, the analyzer 100 according to the first embodiment of the present invention makes it possible that the data held in all the FFs included in the scan paths 101a, 101b and 101c are respectively outputted as the scan path output 103c when the scan mode starts (i.e., when the actual operation mode ends) by inputting the clocks 102 the number of which is equal to the total number of stages in all the FFs included in the scan paths 101a, 101b and 101c to the analyzer.

In the state where the clocks, the number of which is equal to the total number of stages in all the FFs included in the scan paths 101a, 101b and 101c, are inputted to the analyzer, the same data as that when the scan mode starts is held in all the FFs included in the scan paths 101a, 101b and 101c. It is therefore possible that after the data in the FFs included in the scan paths 101a, 101b and 101c are read out in the second scan mode, the operation mode performed by the analyzer is shifted to the actual operation mode and then actual operation is continuously performed.

Figure 1:
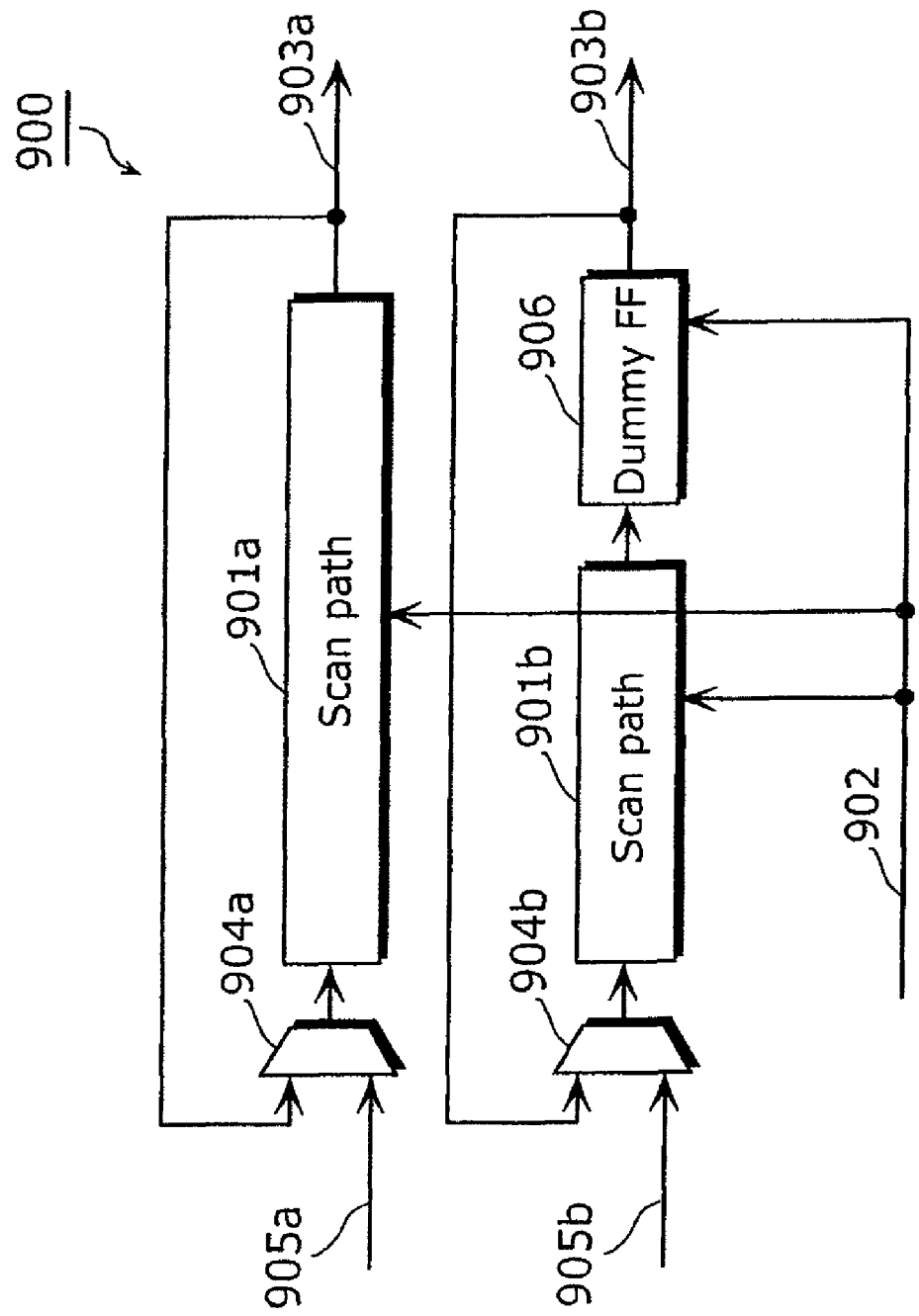
FIG. 1 shows a configuration of a conventional analyzer.

When the numbers of stages in the FFs in the scan paths are different from each other, it is necessary for the conventional analyzer 900 illustrated in FIG. 1 to have the dummy FF 906 in order to perform the actual operation continuously after the scan test. However, in the analyzer 100 according to the first embodiment of the present invention, no dummy FF is required even when the numbers of the stages in the FFs in the scan paths 101a, 101b and 101c are different from each other. Thus, in the analyzer 100 according to the first embodiment of the present invention, an increase in the circuit scale can be prevented.

Second Embodiment

In an analyzer according to a second embodiment of the present invention, the numbers of clocks supplied to individual scan paths are controlled when a scan test is performed. Moreover, the analyzer has a function of looping outputs from the scan paths to inputs thereof. This makes it possible that even when the numbers of stages in the FFs in the scan paths are different from each other, data held in the FFs in the scan paths are returned to the state when the scan test starts, by inputting clocks the numbers of which are equal to the numbers of stages in the individual FFs. Thus, after the scan operation, the actual operation can be continuously performed.

First, the configuration of the analyzer according to the second embodiment of the present invention will be described.

Figure 3:
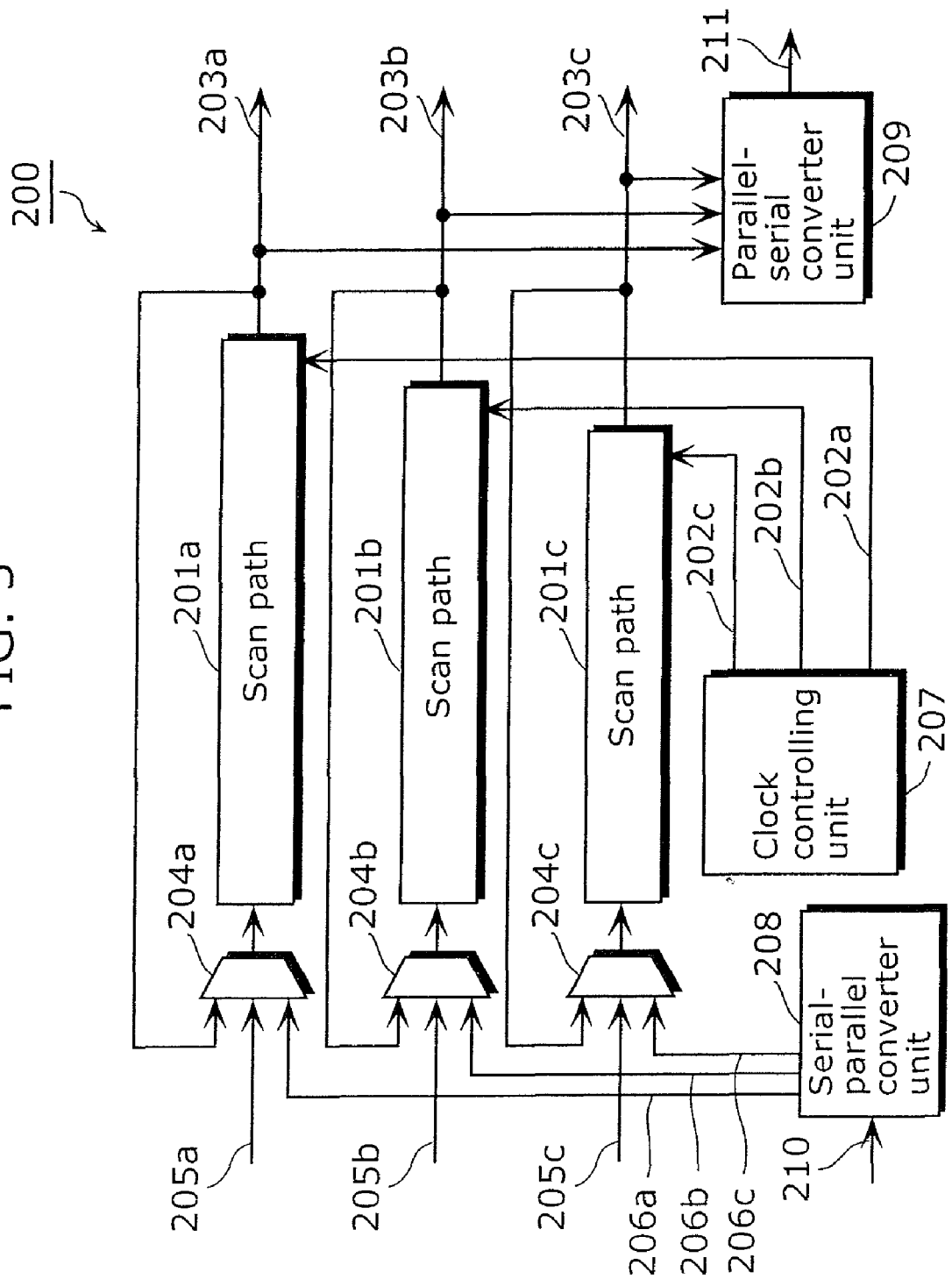
FIG. 3 is shows a configuration of an analyzer according to a second embodiment of the present invention.

FIG. 3 is a block diagram illustrating the configuration of the analyzer according to the second embodiment of the present invention. The analyzer 200 illustrated in FIG. 3 is a circuit which is integrated into, for example, a semiconductor integrated circuit and has a scan function. The analyzer 200 includes scan paths 201a, 201b and 201c, selectors 204a, 204b and 204c, a clock controlling unit 207, a serial-parallel converter unit 208, and a parallel-serial converter unit 209.

The scan paths 201a, 201b and 201c are scan test circuits integrated into an actual operation circuit, and each includes FFs. The FFs included in each of the scan paths 201a, 201b and 201c function as a shift register in the scan mode. The scan path 201a performs a shift operation in accordance with clocks 202a when a scan test is performed to sequentially output data in the FFs included in the scan path 201a as a scan path output 203a. The scan path 201b performs a shift operation in accordance with clocks 202b in the scan test mode to sequentially output data in the FFs included in the scan path 201b as a scan path output 203b. The scan path 201c performs a shift operation in accordance with clocks 202c in the scan test mode to sequentially output data in the FFs included in the scan path 201c as a scan path output 203c. The scan path outputs 203a, 203b and 203c are, for example, signals outputted to the outside of the semiconductor integrated circuit including the analyzer 200.

The selector 204a selects one of the scan path output 203a, a scan path input 205a and a parallel input 206a, and connects the selected one to the input of the scan path 201a. The selector 204b selects one of the scan path output 203b, a scan path input 205b and a parallel input 206b, and connects the selected one to the input of the scan path 201b. The selector 204c selects one of the scan path output 203c, a scan path input 205c and a parallel input 206c, and connects the selected one to the input of the scan path 201c. To put it differently, the selectors 204a, 204b and 204c switch the following first, second and third connection states from each other: a first connection state in which the scan path inputs 205a, 205b and 205c, which are signals respectively written, when a scan test is performed, in the scan paths 201a, 201b and 201c that are respectively connected to the inputs of the scan paths 201a, 201b and 201c; a second connection state in which the scan path outputs 203a, 203b and 203c, which are outputs from the scan paths 201a, 201b and 201c, respectively, are connected to the inputs of the scan paths 201a, 201b and 201c, respectively; and a third connection state in which the parallel inputs 206a, 206b and 206c are connected to the inputs of the scan paths 201a, 201b and 201c, respectively.

The scan path inputs 205a, 205b and 205c are signals set in the FFs in the scan paths 201a, 201b and 201c, respectively, in the scan mode. The scan path inputs 201a, 201b and 201c, are signals inputted from, for example, the outside of the semiconductor integrated circuit including the analyzer 200.

The clock controlling unit 207 outputs clocks 202a, 202b and 202c used in shift operations of the scan paths 201a, 201b and 201c, respectively, in the scan mode. During the scan operation of reading out data in all of the FFs included in the scan paths 201a, 201b and 201c in the scan mode, the clock controlling unit 207 outputs the clocks 202a, 202b and 202c the numbers of which are respectively equal to the numbers of stages in the FFs included in the scan paths 201a, 201b and 201c. To put it differently, in the scan mode, the clock controlling unit 207 supplies, to the scan path 201a, the clocks 202a the number of which is equal to the number of stages in the FFs included in the scan path 201a, supplies, to the scan path 201b, the clocks 202b the number of which is equal to the number of stages in the FFs included in the scan path 201b, and supplies, to the scan path 201c, the clocks 202c the number of which is equal to the number of stages in the FFs included in the scan path 201c. For example, the clock controlling unit 207 holds the numbers of stages in the FFs in the scan paths 201a, 201b and 201c, respectively, and outputs the clocks the numbers of which are equal to the numbers of stages in the FFs included in the scan paths 201a, 201b and 201c, respectively, on the basis of reference clocks inputted from the outside. Thereafter, until the unit 207 outputs clocks the number of which is equal to the number of stages in the FFs included in the scan path that includes an FF in which the number of stages is the largest, out of the scan paths 201a, 201b and 201c, the clock controlling unit 207 masks clocks so as to output no clock.

The serial-parallel converter unit 208 performs serial-parallel conversion to a serial input 210, which is a serial signal, to output parallel inputs 206a, 206b and 206c, which are parallel signals of three bits.

The parallel-serial converter unit 209 performs parallel-serial conversion to the scan path outputs 203a, 203b and 203c, which are parallel signals of 3 bits, to output the serial output 211, which is a serial signal.

The serial input 210 is serial data set in the FFs included in the scan paths 201a, 201b and 201c in the scan mode (specifically, in a third scan mode, which will be described later). The serial input 210 is, for example, a signal inputted from the outside of the semiconductor integrated circuit including the analyzer 200.

The serial outputs 211 are, for example, signals to be outputted to the outside of the semiconductor integrated circuit including the analyzer 200.

The operation of the analyzer 200 is described hereinafter.

An actual operation mode is a mode in which a normal operation of the semiconductor integrated circuit including the analyzer 200 is performed. In the actual operation mode, the FFs included in the scan paths 201a, 201b and 201c are connected to the circuit for actual operation, and operate as FFs in the actual operation circuit. In a scan mode, the FFs included in each of the scan paths 201a, 201b and 201c operate as a shift register. In the scan mode, the scan paths 201a, 210b and 210c perform shift operations through the clocks 202a, 202b and 202c, respectively.

The scan mode includes a first scan mode, a second scan mode and a third scan mode. In the first scan mode, the selectors 204a, 204b and 204c select the scan path inputs 205a, 205b and 205c, respectively. In this way, the scan path inputs 205a, 205b and 205c are sequentially shifted in the scan paths 201a, 201b and 201c, respectively, and then held in the FFs included in the scan paths 201a, 201b and 201c, respectively. Moreover, data held in the FFs included in the scan paths 201a, 201b and 201c are sequentially shifted in the scan paths 201a, 201b and 201c, respectively, and then outputted as the scan path outputs 203a, 203b and 203c, respectively. To put it differently, in the first scan mode, data from the outside can be set in the FFs included in the scan paths 201a, 201b and 201c. Moreover, when the scan mode starts (i.e., when the actual operation mode ends), data held in the FFs included in the scan paths 201a, 201b and 201c can be outputted to the outside.

In the second scan mode, the selectors 204a, 204b and 204c select the scan path outputs 203a, 203b and 203c, respectively. To put it differently, each of the scan paths 201c, 201a and 201b forms a loop between the output and the input. In the second scan mode, the data in the FFs included in the scan paths 201a, 201b and 201c is sequentially outputted as the scan path outputs 203a, 203b and 203c, respectively, when one of the clocks 202a, one of the clocks 202b and one of the clocks 202c are inputted, respectively. Specifically, when one of the clocks 202a is inputted to the scan path 201a, the data in the FF of the last stage in the scan path 201a to the FF of the first stage in the scan path 201a is sequentially outputted as the scan path output 203a. When one of the clocks 202b is inputted to the scan path 201b, the data in the FF of the last stage in the scan path 201b to the FF of the first stage in the scan path 201b is sequentially outputted as the scan path output 203b. When one of the clocks 202c is inputted to the scan path 201c, the data in the FF of the last stage in the scan path 201c to the FF of the first stage in the scan path 201c is sequentially outputted as the scan path output 203c. The data outputted as the scan path outputs 203a, 203b and 203c is sequentially inputted into the FFs of the first stages in the scan paths 201a, 201b and 201c, respectively, through the respective loops. The clock controlling unit 207 outputs, as the clocks 202a, 202b and 202c, the numbers of which are equal to the numbers of stages in the FFs in the scan paths 201a, 201b and 201c, respectively. Thus, when data in all the FFs in the scan paths 201a, 201b and 201c is outputted as the scan path outputs 203a, 203b and 203c, respectively, the data held in the FFs included in the scan paths 201a, 201b and 201c is turned to the same data as when the scan mode starts (i.e., when the actual operation mode ends). Thus, the analyzer according to the second embodiment of the present invention makes it possible that after the data in the FFs included in the scan paths 201a, 201b and 201c is read out in the second scan mode, the operation mode performed by the analyzer is shifted to the actual operation mode and then actual operation is continuously performed.

When the numbers of stages in the FFs in the scan paths are different from each other, it is necessary for the conventional analyzer 900 illustrated in FIG. 1 to have the dummy FF 906 in order to perform the actual operation continuously after the scan test. However, in the analyzer 200 according to the second embodiment of the present invention, no dummy FF is required even when the numbers of stages in the FFs in the scan paths 201a, 201b and 201c are different from each other. Thus, in the analyzer 200 according to the second embodiment of the present invention, an increase in the circuit scale can be prevented.

In the third scan mode, the selectors 204a, 204b and 204c select the parallel inputs 206a, 206b and 206c, respectively. In the same manner as in the first and second scan modes, the scan paths 201a, 201b and 201c perform shift operations in accordance with the clocks 202a, 202b and 202c, respectively. The parallel-serial converter unit 209 subjects the data in the FFs in the scan paths 201a, 201b and 201c outputted as the scan path outputs 203a, 203b and 203c, respectively, to parallel-serial conversion to output the serial outputs 211. When the data held in the FFs in the scan paths 201a, 201b and 201c is converted to the serial data and then the data is outputted, the number of terminals for outputting data can be decreased. Thus, when the actual operation is stopped to enable the scan paths, the number of the terminals for reading out data may be small. It is therefore possible to read out data in the state where many of the terminals are kept in a terminal state in the actual operation mode. For example, when latch circuits or selectors are provided at the rear stages of the scan path outputs 203a, 203b and 203c, respectively, the terminal state in the actual operation mode can be kept.

In the third scan mode, the serial inputs 210, which are serial data set from the outside in the FFs in the scan paths 201a, 201b and 201c, are inputted to the analyzer. The serial-parallel converter unit 208 converts the serial input 210 to parallel data of three bits, and the data is outputted as the parallel inputs 206a, 206b and 206c, respectively. The scan paths 201a, 201b and 201c sequentially perform shift operations in accordance with the clocks 202a, 202b and 202c, respectively. In this way, the parallel inputs 206a, 206b and 206c are set in the FFs in the scan paths 201a, 201b and 201c, respectively. By the conversion of the serial inputs 210 to the parallel data, terminals for inputting data can be decreased. Thus, when actual operation is stopped to enable the scan paths, the number of the terminals for writing data may be small. It is therefore possible to write data in the state where many of the terminals are kept in a terminal state in the actual operation mode. For example, when latch circuits or selectors are provided at the front stages of the scan path inputs 205a, 205b and 205c, respectively, the terminal state in the actual operation mode can be kept.

By reading out the states of the FFs as the serial outputs 211, and inputting the read-out data as the serial inputs 210 and writing the data in the FFs, the state of the circuit at the time of the readout can be repeatedly reproduced.

In the analyzer 200 according to the second embodiment of the present invention, the individual scan paths are independent of each other; therefore, by dividing the scan paths into individual functional blocks, specific one of the functional blocks can be actually operated and the other functional blocks can be caused to perform the scan operation so as to read and write the internal data. Specifically, when the scan paths 201a, 201b and 201c are formed in functional blocks different from each other, the analyzer 200 may further have a mode switching unit for performing control for switching between the scan mode and the actual operation mode in each of the scan paths 201a, 201b and 201c, individually.

Note that, in the above description, the analyzer 200 has routes into which the scan path inputs 205a, 205b and 205c and the serial inputs 210 are inputted from the outside, but may have a route into which only one of the two species of the scan path inputs 205a, 205b and 205c and the serial inputs 210 is inputted. Moreover, in the above description, the analyzer 200 has routes from which the scan path outputs 203a, 203b and 203c and the serial output 211 are outputted to the outside, but may have a route from which only one of the two species of the scan path outputs 203a, 203b and 203c and the serial outputs 211 is outputted to the outside.

The analyzer 100 in the above-mentioned first embodiment may also have the serial-parallel converter unit 208 and the parallel-serial converter unit 209. In this case, the number of terminals used in the scan test can be decreased.

Third Embodiment

An analyzer according to a third embodiment of the present invention has a function of storing read-out data through a loop again into FFs included in scan paths when a scan test is performed. Furthermore, the analyzer has a function of changing the read-out data and storing the changed data again into the FFs included in the scan paths. In this way, data in the FFs can be changed when the operation mode performed by the analyzer is returned to the actual operation mode.

First, the configuration of the analyzer according to the third embodiment of the present invention is described.

Figure 4:
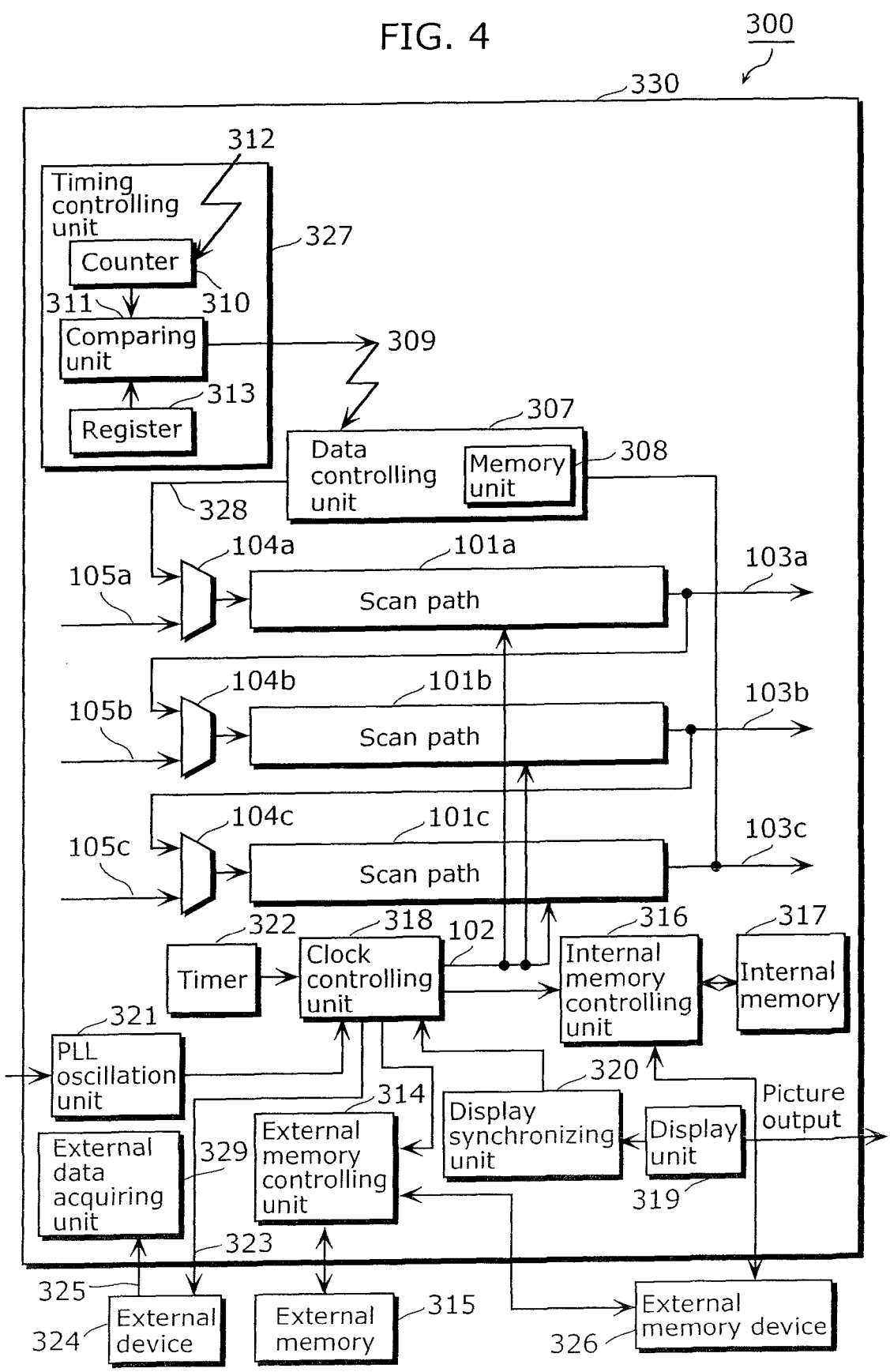
FIG. 4 shows a configuration of an analyzer according to a third embodiment of the present invention.

FIG. 4 is a block diagram illustrating the configuration of the analyzer according to the third embodiment of the present invention.

The analyzer 300 illustrated in FIG. 4 includes a semiconductor device 330, an external memory 315, an external device 324, and an external memory device 326. The semiconductor device 330 is a semiconductor integrated circuit of one chip, and includes scan paths 101a, 101b and 101c, selectors 104a, 104b and 104c, a data controlling unit 307, a timing controlling unit 327, an external memory controlling unit 314, an internal memory controlling unit 316, an internal memory 317, a clock controlling unit 318, a display unit 319, a display synchronizing unit 320, a PLL oscillation unit 321, a timer 322, and an external data acquiring unit 329.

The scan paths 101a, 101b and 101c are scan test circuits integrated into an actual operation circuit, and each includes FFs. The scan paths 101a, 101b and 101c each operate as a shift register in the scan mode. In the scan mode, the scan path 101a performs a shift operation in accordance with clocks 102 to sequentially output data in the FFs included in the scan path 101a as a scan path output 103a. The scan path 101b performs a shift operation in accordance with the clocks 102 in the scan test mode to sequentially output data in the FFs included in the scan path 101b as a scan path output 103b. The scan path 101c performs a shift operation in accordance with the clocks 102 in the scan test mode to sequentially output data in the FFs included in the scan path 101c as a scan path output 103c. The scan path outputs 103a, 103b and 103c are, for example, signals outputted to the outside of the semiconductor device 330.

The selector 104a selects one of a data controlling unit output 328 and a scan path input 105a, and connects the selected one to the input of the scan path 101a. The selector 104b selects one of the scan path output 103b, and a scan path input 105b, and connects the selected one to the input of the scan path 101b. The selector 104c selects one of the scan path output 103c, and a scan path input 105c, and connects the selected one to the input of the scan path 101c. To put it differently, the selectors 104a, 104b and 104c connect the scan paths 101a, 101b and 101c in series, and further connect the data controlling unit output 328 to the input of the scan path 104a of the first stage, or these selectors input, into the scan paths 101a, 101b and 101c, the scan path inputs 105a, 105b and 105c, respectively, which are data to be written in the scan paths 101a, 101b and 101c when a scan test is performed. The scan path inputs 105a, 105b and 105c are, for example, signals inputted from the outside of the semiconductor device 330.

The data controlling unit 307 rewrites data in designated FFs inside the scan paths 101a, 101b and 101c. The data controlling unit 307 converts the logical value of the data in the designated FF as the scan path output 103c to a predetermined logical value, and then outputs the value as the data controlling unit output 328. The data controlling unit 307 has a memory unit 308. The memory unit 308 stores information for specifying the individual FFs included in the scan paths 101a, 101b and 101c. The information stored by the memory unit 308 include, for example, information indicating the serial number of the stage of the FF wherein data to be changed in the scan paths 101a, 101b and 101c and data indicating a logical value ("0" or "1") to be rewritten. When data in FFs is changed, the memory unit 308 stores information for specifying the FFs. The data controlling unit 307 converts data stored in the FFs included in the scan paths 101a, 101b and 101c on the basis of the information for specifying the FFs included in the scan paths 101a, 101b and 101c individually, the information being stored in the memory unit 308.

The timing controlling unit 327 controls the timing at which the operation mode performed by the analyzer is shifted from the actual operation mode to the scan mode. The timing controlling unit 327 includes a counter 310, a comparing unit 311, and a register 313. The counter 310 starts to count a predetermined count value at the timing of a counter start interrupt signal 312 being inputted thereto. The register 313 is a register for holding information on the timing at which the operation mode is shifted to the scan mode. The comparing unit 311 determines whether or not the information held in the register 313 matches the count value of the counter 310. When they match each other, an interrupt signal 309 is activated.

The external memory 315 stores data used in the actual operation. The external memory 315 is a memory formed outside the semiconductor device 330. The external memory 315 is, for example, a volatile memory such as a DRAM.

The external memory controlling unit 314 controls the external memory 315. The external memory controlling unit 314 operates independently of the operations of the scan paths 101a, 101b and 101c when a scan test is performed.

The internal memory 317 stores data used at the time of actual operation. The internal memory 317 is a volatile memory, such as a DRAM, formed in the semiconductor device 330. The internal memory controlling unit 316 controls the internal memory 317. The internal memory controlling unit 316 controls the operation of the internal memory 317 independently of the scan test operations of the scan paths 101a, 101b and 101c when a scan test is performed.

The external memory device 326 is a memory outside the semiconductor device 330, and stores data which the external memory 315 and the internal memory 317 should store when the scan mode starts.

The display unit 319 outputs image data such as picture signals for moving images or the like to the outside at the time of actual operation. The display unit 319 operates independently of the operations of the scan paths 101a, 101b and 101c at the time of scan operation. The display unit 319 outputs image data when the actual operation mode ends, as still image data, in the scan mode. When the operation mode is returned from the scan mode to the actual operation mode, the display synchronizing unit 320 resumes actual operation according to the timing of a synchronizing signal for the display unit 319, the signal being used at the time of actual operation.

The PLL oscillation unit 321 oscillates clocks used in the actual operation. The PLL oscillation unit 321 stops the oscillation in the scan mode to suspend the output of the clocks. The timer 322 counts a predetermined time.

The external device 324 is a device outside the semiconductor device 330, and outputs data input signals 325, such as a picture stream signal, to the semiconductor device 330. The external data acquiring unit 329 acquires the data input signals 325 from the external device 324 at the time of actual operation.

The clock controlling unit 318 outputs the clocks 102 used in the shift operations of the scan paths 101a, 101b and 101c in the scan mode. For example, the clock controlling unit 318 generates the clocks 102 based on clocks inputted from the outside in the scan mode. Furthermore, in the actual operation mode, the clock controlling unit 318 generates clocks used in the actual operation of the internal circuit of the semiconductor device 330 on the basis of the clocks from the PLL oscillation unit 321. Additionally, in the scan mode, the clock controlling unit 318 outputs, to the internal memory controlling unit 316 and the external memory controlling unit 314, clocks independent of the clocks used in the shift operations of the scan paths 101a, 101b and 101c. Furthermore, the clock controlling unit 318 stops the oscillation of the PLL oscillation unit 321 when the operation mode is shifted from the actual operation mode to the scan mode, and resumes the oscillation of the PLL oscillation unit 321 when the operation mode is returned from the scan mode to the actual operation mode. Moreover, the clock controlling unit 318 waits for the stabilization of the oscillation of the PLL oscillation unit 321 and resumes the supply of the clocks used in actual operation when the operation mode is returned from the scan mode to the actual operation mode. Specifically, after the operation mode is shifted from the scan mode to the actual operation mode, the clock controlling unit 318 does not output any clock used in the actual operation until the timer value of the timer 322 becomes a predetermined value (time when the oscillation of the PLL oscillation unit 321 is stabilized). Moreover, the clock controlling unit 318 outputs an external device stop signal 323 to the external device 324. In accordance with the external device stop signal 323, the clock controlling unit 318 stops the external device 324 in the scan mode. When the operation mode is returned from the scan mode to the actual operation mode, the clock controlling unit 318 resumes the operation of the external device 324.

The following describes the operation of the analyzer 300.

First, the operation of the analyzer 300 in the scan mode is described herein. In the same manner as in the first embodiment, the scan mode includes a first scan mode and a second scan mode. The operation of the analyzer 300 in the first scan mode is similar to that of the analyzer 100 described in the first embodiment. Thus, description thereof is omitted.

In the second scan mode, the selectors 104a, 104b and 104c select the data controlling unit output 328, and the scan path outputs 103a and 103b, respectively. Thus, the output from the scan path 101a is connected to the input of the scan path 101b, the output from the scan path 101b is connected to the input of the scan path 101c, and the output from the scan path 101c is connected through the data controlling unit 307 to the input of the scan path 101a. To put it differently, the scan paths 101a, 101b and 101c form a loop as a single shift register in the same manner as in the first embodiment. In the second scan mode, data in the FFs included in the scan paths 101a, 101b and 101c is sequentially outputted as the scan path output 103c when one of the clocks 102 is inputted. Thus, in the same manner as in the first embodiment, it is possible that the data held in all the FFs included in the scan paths 101a, 101b and 101c is each of the end of the actual operation mode) by inputting the clocks 102 the number of which is equal to the total number of stages in all the FFs included in the scan paths 101a, 101b and 101c to the scan paths. Moreover, in the same manner as in the first embodiment, in the state where the clocks 102, the number of which is equal to the total number of stages in all the FFs included in the scan paths 101a, 101b and 101c, are inputted to the scan paths, the same data as to when the scan mode starts are held in all the FFs included in the scan paths 101a, 101b and 101c. It is therefore possible that after the data in the FFs included in the scan paths 101a, 101b and 101c is read out in the second scan mode, the operation mode performed by the analyzer is shifted to the actual operation mode and then actual operation is continuously performed.

Furthermore, in the analyzer 300 according to the third embodiment, the data controlling unit 307 converts the logical value of designated data out of data outputted as the scan path output 103c based on information stored in the memory unit 308, and then inputs the converted value again to the scan path 101a. Specifically, the data controlling unit 307 counts the number of the clocks 102 from the start of the scan mode. When the count value matches the serial number of stage of the FF wherein data to be rewritten, the serial number being stored by the memory unit 308, in the scan paths, the scan path output 103c is changed to a logical value stored by the memory unit 308, and then the value is outputted as the data controlling unit output 328. The information on the serial number of stages in the FF wherein the data to be rewritten in the scan paths and the logical value to be rewritten, each of which is stored by the memory unit 308, are, for example, data inputted from the outside of the semiconductor device 330 before the start of the scan mode. When the count value of the clock number does not match the serial number of stage of the FF wherein the data should be rewritten, the serial number being stored by the memory unit 308, in the scan paths, the data controlling unit 307 does not change the logical value of the scan path output 103c and then outputs the scan path output 103c as the data controlling unit output 328. In this way, in the state where the clocks the number of which is equal to the total number of stages in all the FFs included in the scan paths 101a, 101b and 101c are inputted to the scan paths, the data in the designated FF is rewritten. Regarding the non-rewritten data in the FFs, the same data when the scan mode started is held. It is therefore possible that after the data in the FFs included in the scan paths 101a, 101b and 101c is read out and then the data in designated one out of the FFs is rewritten, the operation mode is shifted to the actual operation mode and then actual operation is continuously performed. This way makes it possible that when data in desired one out of the FFs is changed, the operation thereof is checked. Accordingly, analysis of various failures can easily be conducted.

The following will describe the operation of a shift to the scan mode at a predetermined timing during actual operation.

In or before actual operation, the counter start interrupt signal 312 is inputted to the counter 310. For example, the counter start interrupt signal 312 is inputted thereto from the outside of the semiconductor device 330. The counter 310 starts count at the timing of the counter start interrupt signal 312 being inputted thereto. The comparing unit 311 determines whether or not the value held in the register 313 matches the count value of the counter 310. When they match each other, the interrupt signal 309 is activated. The value held in the register 313 is timing information for shifting the operation mode to the scan mode. For example, the value is inputted from the outside of the semiconductor device 330 before the start of the actual operation. When the interrupt signal 309 becomes active, the scan paths 101a, 101b and 101c are shifted from the actual operation mode to the scan mode. According to the above-mentioned operation, the scan paths can be shifted to the scan mode automatically at a desired timing during actual operation. This manner makes it possible to read out data held by the internal FFs at a desired timing during actual operation or rewrite the data in the internal FFs.

The following describes the operations of the internal memory controlling unit 316 and the external memory controlling unit 314 in the scan mode.

In the actual operation, the internal memory 317 and the external memory 315 are used as memories for holding data used in the actual operation of the semiconductor device 330. In the scan mode, the internal memory controlling unit 316 operates independently of the operations of the scan paths 101a, 101b and 101c. For example, in the scan mode, the internal memory controlling unit 316 continuously performs the refresh operation of the internal memory 317. This makes it possible to hold the data in the internal memory 317 in the scan mode also. Thus, when the operation mode is returned to the actual operation after the scan mode, the internal memory 317 can hold the data when the scan mode starts (i.e., when the actual operation mode ends). In this way, the actual operation can be continuously performed after the end of the scan operation.

In the scan mode, the external memory controlling unit 314 operates independently of the operations of the scan paths 101a, 101b and 101c. For example, in the scan mode, the external memory controlling unit 314 continuously performs the refresh operation of the external memory 315. This makes it possible to hold the data in the external memory 315 also in the scan mode. Thus, when the operation mode is returned to the actual operation after the scan mode, the external memory 315 can hold the data when the scan mode starts (i.e., when the actual operation mode ends). In this way, the actual operation can be continuously performed after the end of the scan operation.

Instead of causing the internal memory 317 and the external memory 315 to operate independently of the scan path operation in the scan mode, the following operation may be performed. At the end of the actual operation mode (i.e., before the start of the scan mode), the internal memory controlling unit 316 reads out data held in the internal memory 317, and then causes the data to be stored in the external memory device 326. The external memory controlling unit 314 reads out data held in the external memory 315, and then causes the data to be stored in the external memory device 326. When the scan mode ends (i.e., before the resuming of the actual operation mode), the internal memory controlling unit 316 reads out, from the external memory device 326, data held in the internal memory 317 when the actual operation mode ends, and again writes the data in the internal memory 317. The external memory controlling unit 314 reads out, from the external memory device 326, data held in the external memory 315 when the actual operation mode ends, and again writes the data in the external memory 315. This makes the following possible: even when data in the internal memory 317 and the external memory 315 is lost by the scan test operation, data held in the internal memory 317 and the external memory 315 when the operation mode is returned to the actual operation mode can be made identical to that when the actual operation mode ends. Thus, the actual operation can be continuously performed after the end of the scan operation.

The following describes the operations of the display unit 319 and the display synchronizing unit 320.

In actual operation, the display unit 319 outputs picture signals for moving images or the like to the outside. The picture signals outputted from the display unit 319 may be picture signals indicating the operation state of the semiconductor device 330, or the like. In the scan mode, the display unit 319 continues to output, as still images, picture signals outputted when the scan mode starts (i.e., when the actual operation mode ends). This makes it possible to avoid a problem that when analysis is conducted while the image is seen, the output of the image data is stopped, whereby the synchronizing signals for display are stopped so that no image is outputted.

When the operation mode is returned from the scan mode to the actual operation mode, the display synchronizing unit 320 matches the timing at which the actual operation is resumed with the synchronizing signal for the display unit 319. For example, the display synchronizing unit 320 causes the clock controlling unit 318 to resume the output of clocks used in the actual operation in accordance with the timing of the synchronizing signal for the display unit 319. This makes it possible to prevent a timing lag of pictures after the return, or a synchronization lag immediately after the return.

The following describes the operation of the clock controlling unit 318.

In the actual operation mode, the clock controlling unit 318 generates clocks used in the actual operation on the basis of clocks outputted from the PLL oscillation unit 321. In the scan mode, the clock controlling unit 318 stops the operation of the clock output from the PLL oscillation unit 321. This makes it possible to reduce the generation of noises due to the oscillation operation of the PLL oscillation unit 321 in the scan mode, and also reduce the power consumption in the scan mode.

When the operation mode is returned from the scan mode to the actual operation mode, the PLL oscillation unit 321 starts oscillation by the control of the clock controlling unit 318. At the same time when the PLL oscillation unit 321 starts the oscillation operation, the timer 322 counts a predetermined time by the control of the clock controlling unit 318. The time that the timer 322 counts is time until the oscillation operation of the PLL oscillation unit 321 is stabilized. After the timer 322 counts the time until the oscillation operation of the PLL oscillation unit 321 is stabilized, the clock controlling unit 318 generates clocks used in actual operation from the clocks outputted from the PLL oscillation unit 321, and then supplies the generated clocks to each of the circuits in the semiconductor device 330. In this way, the scan paths can be returned to the actual operation in accordance with the stable clocks, so that the occurrence of malfunction can be prevented.

The clock controlling unit 318 stops the output of data from the external device 324 when the operation mode is shifted from the actual operation mode to the scan mode. When the operation mode is returned from the scan mode to the actual operation mode, the clock controlling unit 318 causes the external device 324 to resume data output. This makes it possible that even when the operation mode is shifted from the actual operation mode to the scan mode and again returned to the actual operation mode, the operation is properly performed.

As described above, in the same manner as in the first embodiment, in the analyzer 300 according to the third embodiment of the present invention, the same data as when the scan mode starts is held in all the FFs included in the scan paths 101a, 101b and 101c in the state where the clocks the number of which is equal to the total number of stages in all the FFs included in the scan paths 101a, 101b and 101c are inputted to the scan paths. Thus, it is possible that after the data in the FFs included in the scan paths 101a, 101b and 101c is read out in the second scan mode, the operation mode is shifted to the actual operation mode and then the actual operation is continuously performed.

Furthermore, in the analyzer 300 according to the third embodiment of the present invention, the data controlling unit 307 converts the logical value of designated one out of data outputted as the scan path output 103c based on data stored in the memory unit 308, and inputs the converted value into the scan path 101a again. In this way, the data in the designated FF can be rewritten in the state where clocks the number of which is equal to the total number of stages in all the FFs included in the scan paths 101a, 101b and 101c are inputted to the scan paths. This way makes it possible that when the data in desired one out of the FFs is changed, the operation thereof is checked. Accordingly, analysis of various failures can easily be conducted.

The timing controlling unit 327 counts a predetermined value from the time when the counter start interrupt signal 312 is inputted thereto, and then activates the interrupt signal 309. When the interrupt signal 309 becomes active, the scan paths 101a, 101b and 101c are shifted from the actual operation mode to the scan mode. In this manner, the scan paths can be shifted to the scan mode automatically at a desired timing during the actual operation. Thus, data held by the internal FFs at a desired timing during the actual operation can be read out, or the data in the internal FFs can be rewritten.

In the scan mode, the internal memory 317 and the external memory 315 operate independently of the operations of the scan paths 101a, 101b and 101c. This makes it possible that when the operation mode is returned to actual operation after the scan mode, the internal memory 317 and the external memory 315 hold data when the scan mode starts. For this reason, after the end of scan operation, the actual operation can be continuously performed.

In the scan mode, the display unit 319 continues to output picture signals outputted when the scan mode starts as still images. Therefore, when analysis is conducted while images are seen, it is possible to avoid a problem that the synchronizing signal for display is stopped by the stop of the output of the image data so that no image is outputted.

When the operation mode is returned from the scan mode to the actual operation mode, the display synchronizing unit 320 causes the timing of the return to the actual operation to be matched with the synchronizing signal for the display unit 319. This makes it possible to prevent a timing lag of pictures after the return, or a synchronization lag immediately after the return.

In the scan mode, the clock controlling unit 318 stops the operation of the output of clocks from the PLL oscillation unit 321. This makes it possible to reduce the generation of noises due to the oscillation operation of the PLL oscillation unit 321 in the scan mode, and further reduce the power consumption in the scan mode.

The clock controlling unit 318 generates clocks used in the actual operation from clocks outputted by the PLL oscillation unit 321 after the oscillation operation of the PLL oscillation unit 321 is stabilized. It is therefore possible that the operation mode is returned to the actual operation mode in accordance with the stable clocks to prevent the occurrence of malfunction.

When the operation mode is shifted from the actual operation mode to the scan mode, the clock controlling unit 318 stops the data output from the external device 324. When the operation mode is shifted from the scan mode to the actual operation mode, the clock controlling unit 318 resumes the data output from the external device 324. This makes it possible to perform normal operations even when the operation mode is shifted from the actual operation mode to the scan mode and again returned to the actual operation mode.

The above description concerns an example wherein, as the configuration of the scan paths included in the analyzer 300, the configuration described in the first embodiment is used, but the configuration described in the second embodiment may also be applied.

Fourth Embodiment

An analyzer according to a fourth embodiment of the present invention includes functional blocks for transmitting and receiving data asynchronously. When the operation mode performed by the analyzer is returned from the scan mode to the actual operation mode, an acknowledge signal is used to transmit the state of one or some of the functional blocks to another functional blocks. This makes it possible to prevent the occurrence of inconveniences such as data loss when the operation mode is returned to the actual operation mode.

First, the configuration of the analyzer according to the fourth embodiment of the present invention is described herein.

Figure 5:
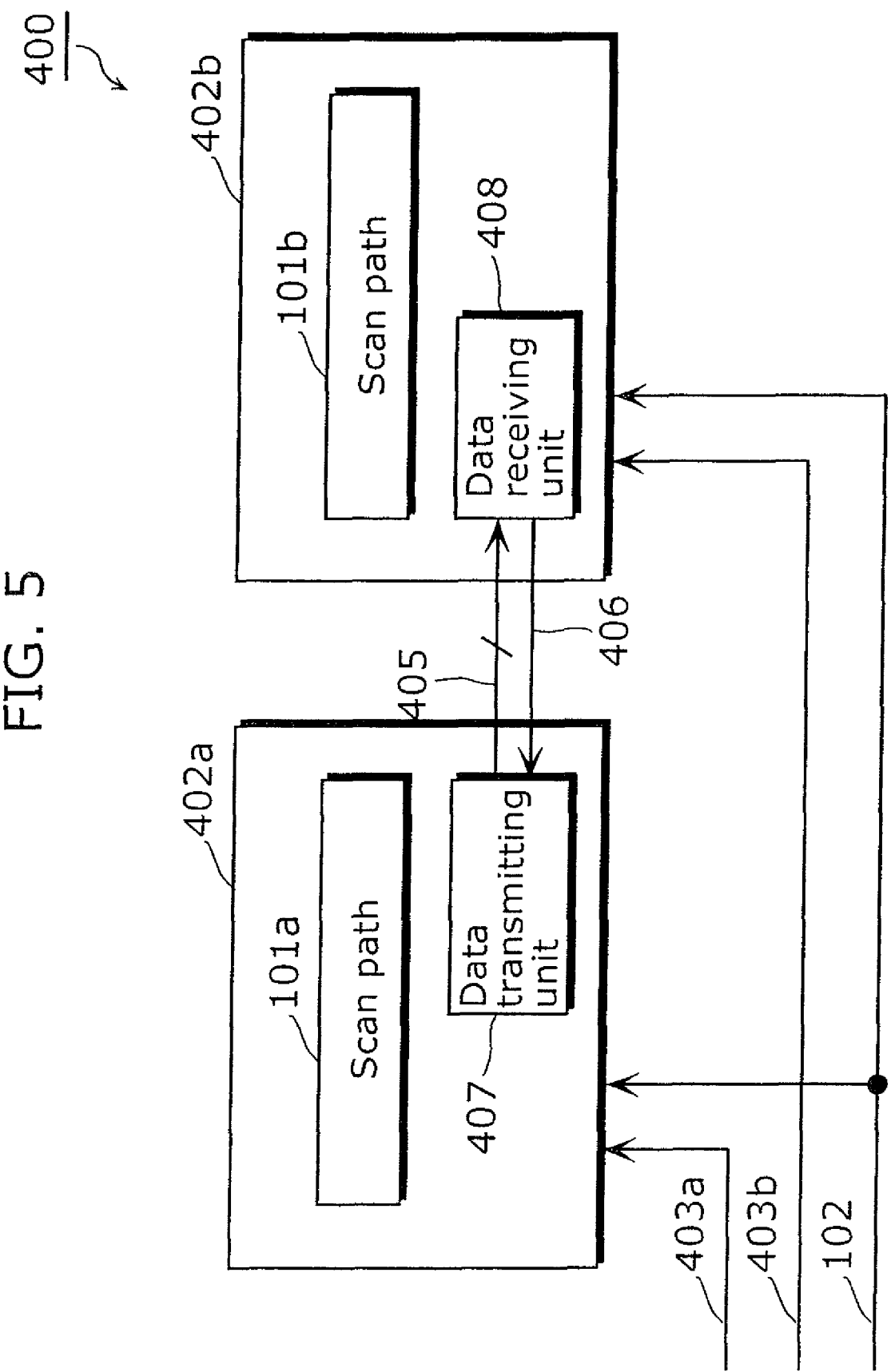
FIG. 5 shows a configuration of an analyzer according to a fourth embodiment of the present invention.

FIG. 5 is a block diagram illustrating the configuration of the analyzer according to the fourth embodiment of the present invention.

The analyzer 400 illustrated in FIG. 5 includes functional blocks 402a and 402b. The functional block 402a has a scan path 101a and a data transmitting unit 407. The functional block 402b has a scan path 101b and a data receiving unit 408. The functional blocks 402a and 402b operate by use of actual operation clocks 403a and 403b, respectively, which are asynchronous at the time of actual operation. To put it differently, the functional block 402b operates asynchronously with the functional block 402a in the actual operation. In the scan mode, the scan paths 101a and 101b perform shift operations in accordance with common clocks 102. For example, the scan paths 101a and 101b have the same configurations as the scan paths 101a and 101b included in the analyzer 100 described in the first embodiment. The scan paths 101a and 101b may have the same configurations as the scan paths included in the analyzer 200 described in the second embodiment. The data transmitting unit 407 transmits data signals 405 to the functional block 402b at the time of actual operation. When the data receiving unit 408 properly receives data from the data transmitting unit 407, the data receiving unit 408 generates an acknowledge signal (hereinafter abbreviated to the "ack signal") 406 for notifying the functional block 402a that the data is received. The data receiving unit 408 transmits the ack signal 406 to the functional block 402a when the operation mode is shifted from the scan test mode to the actual operation mode, and the functional block 402b can receive data.

The following describes the operation of the analyzer 400.

At the time of actual operation, the functional blocks 402a and 402b operate by use of the actual operation clocks 403a and 403b, respectively, which are asynchronous. In the actual operation, data is transmitted through the data signals 405 from the functional block 402a to the functional block 402b. The data receiving unit 408 in the functional block 240b uses the ack signal 406 to send a reply as to whether or not correct transmission is performed.

In the scan mode, the scan paths 101a and 101b perform the scan operation in accordance with the common clocks 102. In the case where data in the scan paths 101a and 101b is read out in the scan mode and subsequently the operation mode is returned to the actual operation, the functional block 402b transmits the ack signal 406 to the functional block 402a when the functional block 402b turns into a state where data from the functional block 402a can be received. In normal asynchronous communication, the phase difference between the asynchronous actual operation clocks 403a and 403b is varied between the time of the stop of the actual operation and the time of the return to the actual operation. Therefore, a part of data may be lost or duplicate transmission may be caused; however, in the analyzer 400 according to the fourth embodiment of the present invention, the functional block 402b notifies the functional block 402a of whether or not data can be received by use of the ack signal 406, thereby making it possible to avoid the partial loss of data and the occurrence of duplicate transmission, so as to transmit the correct data.

Fifth Embodiment

An analyzer according to a fifth embodiment of the present invention includes a functional block which operates asynchronously. Furthermore, the phase difference of asynchronous clocks for this block from other clocks is stored when the operation mode performed by the analyzer is shifted to the scan mode. The phase difference of the asynchronous clocks when the operation mode is returned to the actual operation mode is set to the stored phase difference. This makes it possible to prevent the occurrence of inconveniences such as data loss when the operation mode is returned to the actual operation mode.

First, the configuration of the analyzer according to the fifth embodiment of the present invention is described herein.

Figure 6:
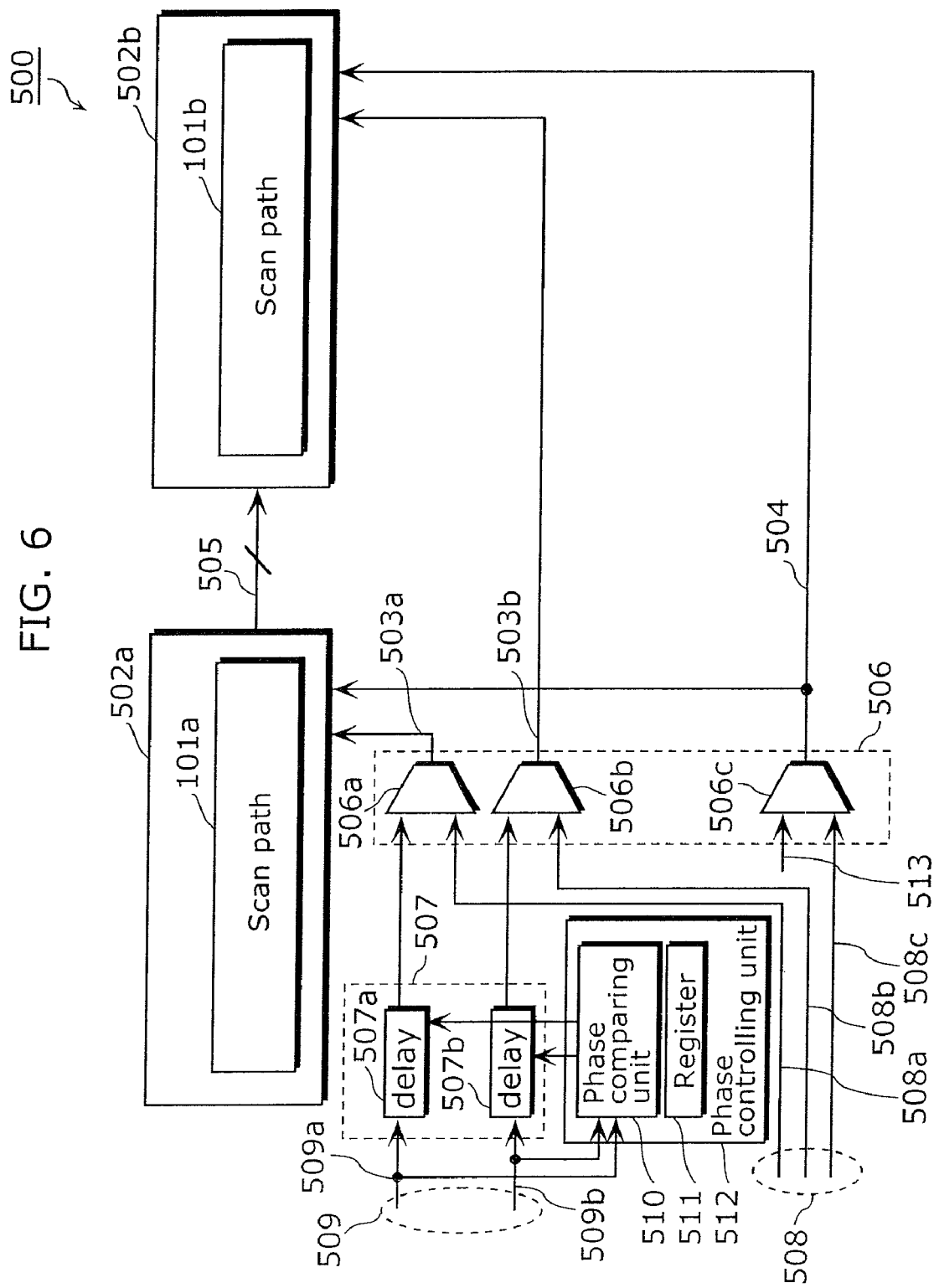
FIG. 6 shows a configuration of an analyzer according to a fifth embodiment of the present invention.

FIG. 6 is a block diagram illustrating the configuration of the analyzer according to the fifth embodiment of the present invention.

The analyzer 500 illustrated in FIG. 6 includes functional blocks 502a and 502b, a selector 506, a delay controlling unit 507, an external clock input 508, a phase controlling unit 512, and an actual operation clock input 509.

The functional block 502a has a scan path 101a. The functional block 502b has a scan path 101b. The functional block 502a operates in accordance with an actual operation clock 403a at the time of actual operation. The functional block 502b operates in accordance with an actual operation clock 403b asynchronous with the actual operation clock 403a at the time of the actual operation. The functional block 502a transmits data signals 505 to the functional block 502b at the time of the actual operation. The scan paths 101a and 101b perform scan operations in accordance with the same clock 504 in the scan mode. For example, the scan paths 101a and 101b have the same configuration as the scan paths 101a and 101b included in the analyzer 100 described in the first embodiment. The configuration of the scan paths 101a and 101b may have the same configuration as the scan paths included in the analyzer 200 described in the second embodiment.

Into the external clock input 508, clocks 508a, 508b and 508c which are synchronous one another are inputted from the outside of the analyzer 500.

Into the actual operation clock input 509, asynchronous clocks 509a and 509b are inputted. The clocks 509a and 509b are clocks used in the functional blocks 502a and 502b, respectively, at the time of actual operation.

The delay controlling unit 507 gives a predetermined delay to the clocks 509a and 509b, and outputs the resultant clocks. The delay controlling unit 507 has delay circuits 507a and 507b. The delay circuit 507a gives a predetermined delay to the clock 509a to output the resultant clock. The delay circuit 507b gives a predetermined delay to the clock 509b to output the resultant clock.

The selector 506 includes selectors 506a, 506b and 506c. The selector 506a selects the signal outputted from the delay circuit 507a or the clock 508a inputted to the external clock input, so as to supply the selected one to the functional block 502a. The selector 506b selects the signal outputted from the delay circuit 507b or the clock 508b inputted to the external clock input, so as to supply the selected one to the functional block 502b. The selector 506c selects a clock 513 or the clock 508c inputted to the external clock input, so as to supply the selected one to the functional blocks 502a and 502b. The clock 513 is, for example, a clock that is inputted from the outside of a semiconductor integrated circuit including the analyzer 500 and is used in the scan test operation.

The phase controlling unit 512 controls the delay of the delay controlling unit 507 when the operation mode is returned from the scan mode to the actual operation mode. The phase controlling unit 512 has a phase comparing unit 510 and a register 511. The phase comparing unit 510 detects the phase difference between the clock 509a and the clock 509b inputted into the actual operation clock input 509 when the operation mode is shifted from the actual operation mode to the scan mode. The register 511 holds the phase difference detected by the phase difference comparing unit 510. The phase controlling unit 512 controls the delay of the delay controlling unit 507 to make the phase difference between the clocks 509a and 509b equal to the phase difference held by the register 511 when the operation mode is shifted from the scan mode to the actual operation mode.

The following describes the operation of the analyzer 500.

In the actual operation, the functional blocks 502a and 502b operate in accordance with the asynchronous clocks 503a and 503b, respectively. In the actual operation, data is transmitted from the functional block 502a to the functional block 502b through the data signals 505. The delay controlling unit 507 outputs the clocks 509a and 509b inputted into the actual operation clock input 509 without giving any delay to the clocks. The selectors 506a and 506b select the signal outputted from the delay controlling unit 507 to output the signal to the functional blocks 502a and 502b. To put it differently, the clock 509a is supplied as the clock 503a to the functional block 502a, and the clock 509b is supplied as the clock 503b to the functional block 502b in the actual operation.

In the scan mode, the selector 506c selects the clock 513 and supplies the clock as the clock 504 to the functional blocks 502a and 502b. The scan paths 101a and 101b perform scan operations in accordance with the common clock 504. When the operation mode is shifted from the actual operation mode to the scan mode, the phase comparing unit 510 compares phases of the clocks 509a and 509b, when the actual operation mode ends, with each other. The register 511 holds the comparison result of the clock phases from the phase comparing unit 510. When data in the scan paths 101a and 101b is read out in the scan mode and then the operation mode is returned to the actual operation mode, the phase controlling unit 512 controls the delays of the delay circuits 507a and 507b to make the phase difference held in the register 511 equal to the clock phase difference outputted by the delay controlling unit 507. To put it differently, the phase controlling unit 512 controls the delay of the delay controlling unit 507 to make the phase difference between the clocks 503a and 503b inputted to the functional blocks 502a and 502b when the actual operation mode ends, equal to the phase difference therebetween at the time of the return to the actual operation mode. This makes it possible to prevent the occurrence of inconveniences such as the partial loss of data or duplicate transmission of data when the operation mode is returned to the actual operation mode.

When the selector 506 selects the external clock input 508, without performing any processing by the phase controlling unit 512 nor the delay controlling unit 507, so as to cause the clocks 508a, 508b and 508c synchronous with each other to be inputted to the external clock input 508, it is similarly possible to prevent the occurrence of inconveniences such as the partial loss of data and duplicate transmission of data.

In the above description, the analyzer 500 has the selector 506, the delay controlling unit 507, and the phase controlling unit 512; however, the analyzer 500 may not have the selector 506. To put it differently, when the operation mode is returned to the actual operation mode, only the adjustment of the phase difference may be performed by the phase controlling unit 512 and the delay controlling unit 507. Furthermore, the analyzer 500 may neither have the delay controlling unit 507 nor the phase controlling unit 512 so as to conduct only the above described clock-switching by the selector 506 when the operation mode is returned to the actual operation mode.

Sixth Embodiment

An analyzer according to a sixth embodiment of the present invention includes two semiconductor devices having the same circuit configuration. The two semiconductor devices are caused to operate with a time lag. When a failure occurs in one of the device which operates earlier, the analyzer reads out internal signals of the other device which operates later, by use of its scan path. This makes it possible to read out the state of the internal circuit before the occurrence of the failure.

First, the configuration of the analyzer according to the sixth embodiment of the present invention is described herein.

Figure 7:
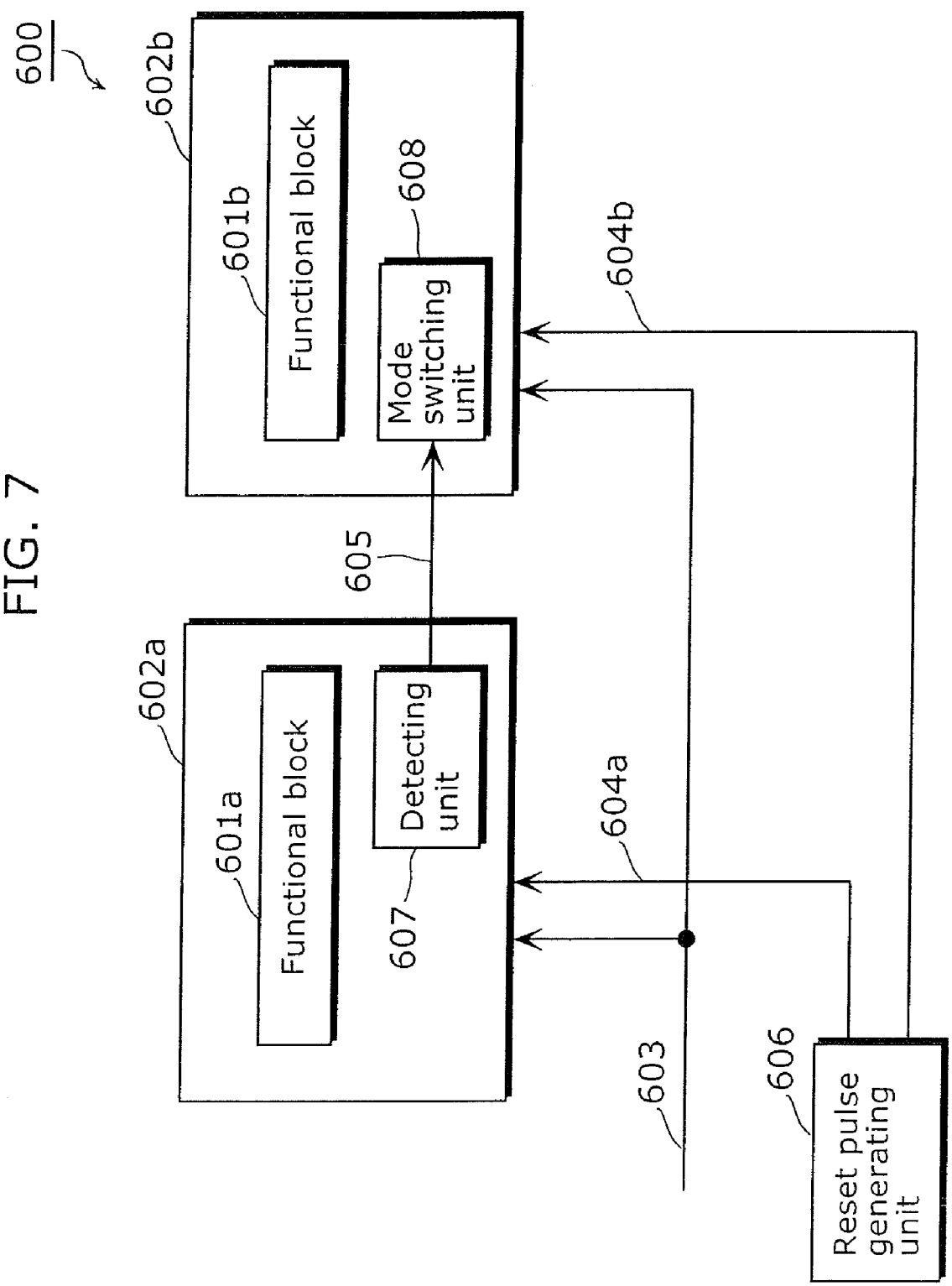
FIG. 7 shows a configuration of an analyzer according to a sixth embodiment of the present invention.

FIG. 7 is a block diagram illustrating the configuration of the analyzer according to the sixth embodiment of the present invention.

The analyzer 600 illustrated in FIG. 7, includes semiconductor devices 602a and 602b, and a reset pulse generating unit 606. The semiconductor devices 620a and 602b are semiconductor integrated circuits of one chip, respectively. The semiconductor device 602a has a functional block 601a and a detecting unit 607. The semiconductor device 602b has a functional block 601b and a mode switching unit 608. The semiconductor devices 602a and 602b are semiconductor integrated circuits having the same circuit configuration and the same function except that the devices 602a and 602b have the detecting unit 607 and the mode switching unit 608, respectively. Each of the functional blocks 601a and 601b is, for example, a functional block including the analyzer 100 described in the first embodiment. The functional blocks 601a and 601b perform scan operations in accordance with clocks 603 in the scan mode. The functional blocks 601a and 601b may be the analyzer 200, 300, 400 or 500, which has been described in any of the second to fifth embodiments, or may be an analyzer 700 according to a fifth embodiment, to be described later.

In the actual operation mode, the detecting unit 607 detects an internal failure for which analysis is required, such as a functional failure caused in the semiconductor device 602a. When the detecting unit 607 detects a failure in the semiconductor device 602a, the detecting unit 607 generates an interrupt signal 605 for notifying that the failure occurs and then outputs the signal to the outside.

When the operation mode switching unit 608 receives the interrupt signal 605 in the actual operation mode, the switching unit 608 stops the actual operation of the semiconductor device 602b and switches the operation mode of the semiconductor device 602b to the scan mode so as to perform a scan test.

The reset pulse generating unit 606 generates reset signals 604a and 604b for resetting the operations of the semiconductor devices 602a and 602b, respectively. The reset pulse generating unit 606 makes the timings of releasing the reset signals different from each other, thereby activating the semiconductor devices 602a and 602b at different timings.

The following describes the operation of the analyzer 600.

First, the reset pulse generating unit 606 asserts the reset signals 604a and 604b (i.e., brings the semiconductor devices 602a and 602b into reset states). Next, the reset pulse generating unit 606 negates the reset signal 604a. In this way, the actual operation of the semiconductor device 602a is started. After a predetermined period from the time when the reset pulse generating unit 606 negates the reset signal 604a, the reset pulse generating unit 606 negates the reset signal 604b.

In this way, the semiconductor device 602b starts the actual operation behind the operation of the semiconductor device 602a.

When a state, for which analysis is required, such as a functional failure, occurs in the actual operation of the semiconductor device 602a, the detecting unit 607 generates the interrupt signal 605. When the semiconductor device 602b receives the interrupt signal 605, the device 602b stops the actual operation thereof and is then shifted to the scan mode. In the scan mode, the scan path included in the functional block 601b in the semiconductor device 602b outputs data held therein to the outside. Since the semiconductor device 602b operates later than the semiconductor device 602a by the predetermined time, the data read out from the functional block 601b by the scan operation is data immediately before the failure occurs in the semiconductor device 602b. Thus, the analyzer 600 according to the sixth embodiment of the present invention can conduct analysis on the internal state of the circuit immediately before the failure occurs. It is preferred that the time from the negation of the reset signal 604a to the negation of the reset signal 604b is set in accordance with the operation speed of the circuit and a desired timing for conducting the analysis before the occurrence of the failure.

In the above description, the semiconductor device 602a has the detecting unit 607 and the semiconductor device 602b has the operation mode switching unit 608; however, each of the semiconductor devices 602a and 602b may have a detecting unit 607 and a mode switching unit 608. In short, the semiconductor devices 602a and 602b may be semiconductor integrated circuits having the same circuit configuration.

In the above description, the semiconductor devices 602a and 602b are semiconductor integrated circuits having the same circuit configuration; however, the devices may have circuits with different configurations as long as the devices have the same circuit for conducting analysis by a scan operation.

Seventh Embodiment

An analyzer according to a seventh embodiment of the present invention monitors data held in a specific FF included in its scan path in the actual operation mode, and is shifted from the actual operation mode to a scan mode when the data held in the specific FF is turned to a predetermined data. This makes it possible to conduct analysis on the internal state easily.

First, the configuration of the analyzer according to the seventh embodiment of the present invention is described herein.

Figure 8:
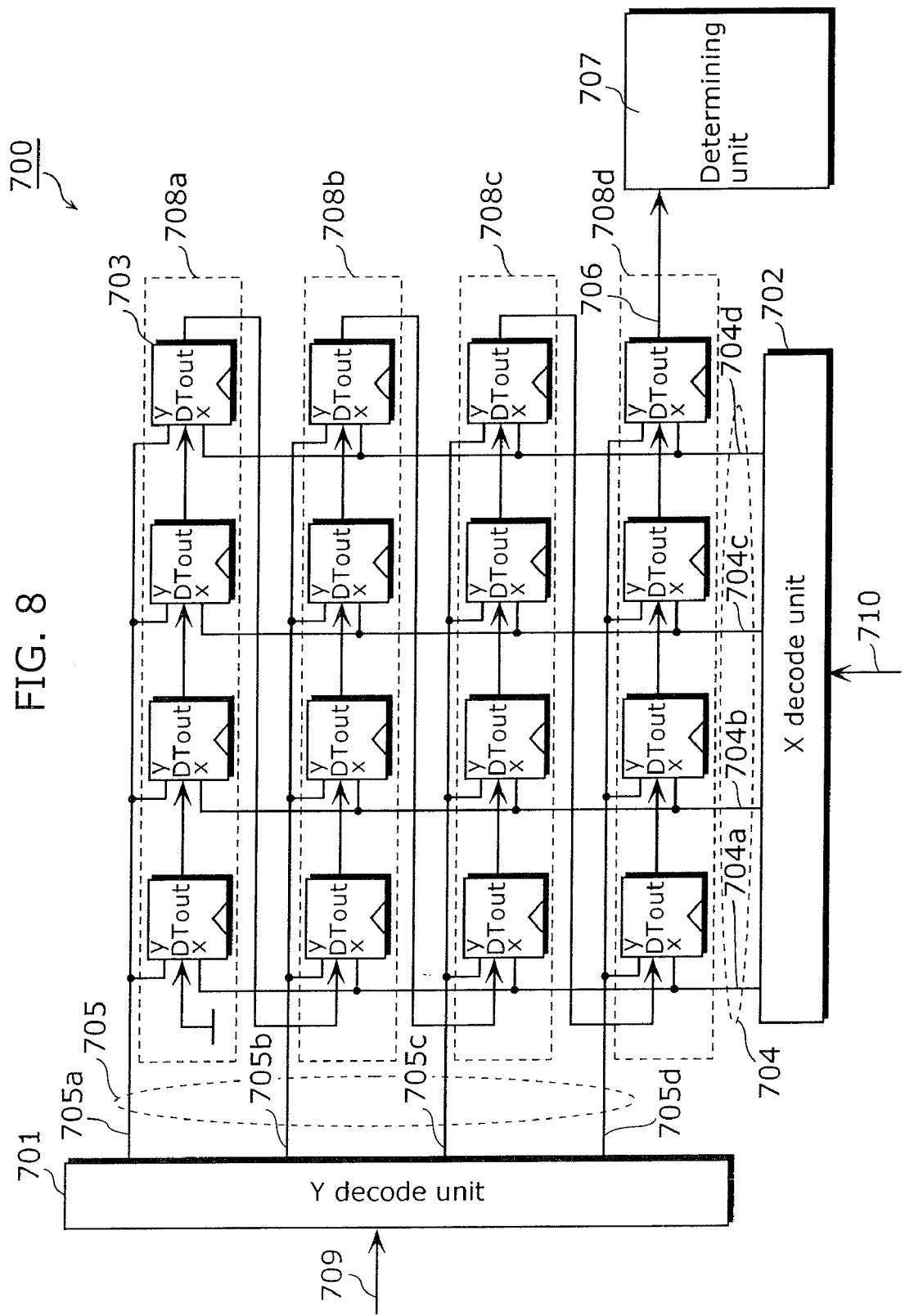
FIG. 8 shows a configuration of an analyzer according to a seventh embodiment of the present invention.

FIG. 8 is a block diagram illustrating the configuration of the analyzer according to the seventh embodiment of the present invention.

The analyzer 700 illustrated in FIG. 8 includes a Y decode unit 701, an X decode unit 702, a determining unit 707, and scan paths 708a, 708b, 708c and 708d.

The scan paths 708a, 708b, 708c and 708d each have scan FFs 703. The scan paths 708a, 708b, 708c and 708d are, for example, scan paths included in the scan path 101a which the analyzer 100 according to the first embodiment has.

The Y decode unit 701 decodes a Y address signal 709 to generate a Y address decode signal 705. The Y address decode signal 705 includes Y address decode signals 705a, 705b, 705c and 705d. The Y address decode signals 705a, 705b, 705c and 705d correspond to the scan paths 708a, 708b, 708c and 708d, respectively. In accordance with the Y address signal 709, the Y decode unit 701 sets any one of the Y address decode signals 705a, 705b, 705c and 705d to "1" and sets the others to "0". The Y address signal 709 is, for example, a signal of two bits which is inputted from the outside of the semiconductor integrated circuit including the analyzer 700.

The X decode unit 702 decodes an X address signal 710 to generate an X address decode signal 704. The X address decode signal 704 includes X address decode signals 704a, 704b, 704c and 704d. The X address decode signals 704a, 704b, 704c and 704d correspond to addresses in the transverse direction in FIG. 8, respectively. In accordance with the X address signal 710, the X decode unit 702 sets any one of the X address decode signals 704a, 704b, 704c and 704d to "1", and sets the others to "0". The X address signal 710 is, for example, a signal of two bits which is inputted from the outside of the semiconductor integrated circuit including the analyzer 700.

In accordance with the Y address decode signal 705 and the X address decode signal 704 generated by the Y decode unit 701 and the X decode unit 702, respectively, a specific scan FF is selected from the scan FFs 703.

The scan FF 703 selected through the Y address decode signal 705 and the X address decode signal 704 uses the scan path to output data held therein to the scan FF 703 at the stage immediately after the selected scan FF. Each of the scan FFs 703 not selected through the Y address decode signal 705 and/or the X address decode signal 704 through-outputs data outputted from the scan FF 703 at the stage immediately before the unselected scan FF 703 to the scan FF 703 at the stage immediately after the unselected scan FF 703.

The determining unit 707 decides whether or not a scan out 706 matches a predetermined data. Furthermore, when the scan out 706 matches the predetermined data, the determining unit 707 stops the actual operation so as to switch the operation mode from the actual operation mode to the scan mode, thereby performing a scan test.

Figure 9:
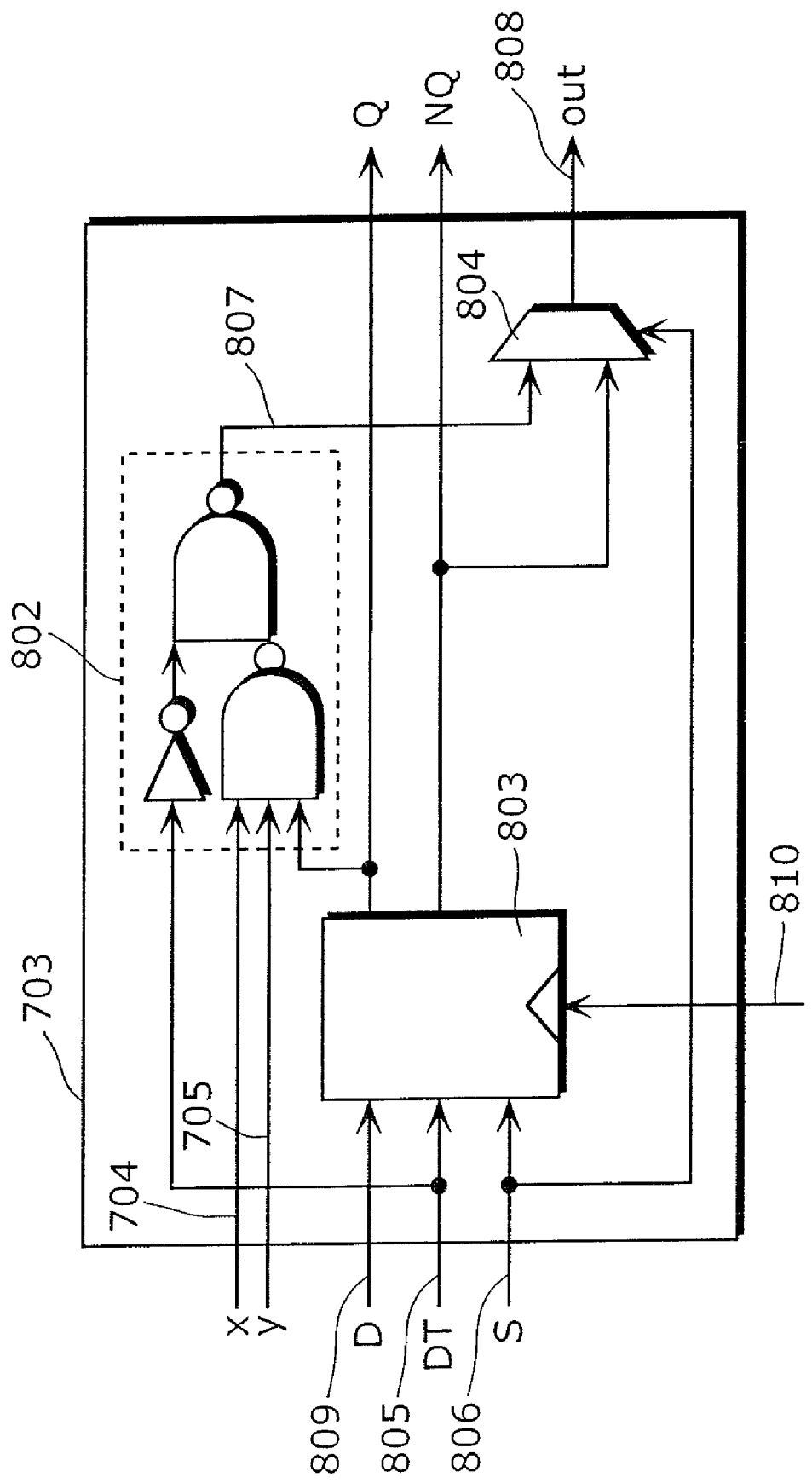
FIG. 9 shows a configuration of a scan flip-flop in the analyzer according to the seventh embodiment of the present invention.

FIG. 9 illustrates the configuration of the scan FF 703. The scan FF 703 illustrated in FIG. 9 has a decode circuit 802, an FF 803 and a selector 804.

A scan input 805 is connected to a scan output 808 from the scan FF 703, on the scan path, at the stage before the FF 703. A scan mode signal 806 is a signal indicating the scan mode or the actual operation mode, and is, for example, "1" in the scan mode and "0" in the actual operation mode.

A decode circuit 802 outputs a Q output from the scan FF 703 as a decode circuit output 807 when the X address decode signal 704 and the Y address decode signal 705 are both "1". The decode circuit 802 outputs the scan input 805 as the decode circuit output 807 when one of the X address decode signal 704 and the Y address decode signal 705 is "0". In short, the scan FF 703 is selected by the logical sum of the X address decode signal 704 and the Y address decode signal 705.

In accordance with the scan mode signal 806, the selector 804 outputs an NQ output from the scan FF 703 or the decode circuit output 807. Specifically, the selector 804 outputs the NQ output from the scan FF 703 as a scan output 808 in the scan mode, and outputs the decode circuit output 807 as the scan output 808 in the actual operation mode.

In accordance with the scan mode signal 806, the FF 803 takes in the scan input 805 or a data input 809 by the aid of clocks 810. Specifically, in the scan mode, the FF 803 takes in the scan input 805 by the aid of the clocks 810; in the actual operation mode, the FF 803 takes in the data input 809 by the aid of the clocks 810.

The following describes the operation of the analyzer 700 in the actual operation mode.

In the actual operation mode, any one of the scan FFs 703 is selected, as an FF including data to be monitored, in accordance with the Y address signal 709 and the X address signal 710. The Y decode unit 701 and the X decode unit 702 set each of the Y address decode signal 705 and the X address decode signal 704 of the selected scan FF 703 to "1". Thus, the data held by the selected scan FF 703 is outputted as the scan output 808. In the unselected scan FFs 703, at least one of the Y address decode signal 705 and the X address decode signal 704 is set to "0", so that the scan input 805 is outputted, as it is, as the scan output 808. To put it differently, the data held by the selected scan FF 703 passes through the scan FFs 703 at the rear stage so as to be outputted as the scan out 706 to the determining unit 707. The determining unit 707 monitors the signal of the scan out 706, that is, the signal held in the selected scan FF 703. The determining unit 707 is shifted from the actual operation mode to the scan mode when the scan out 706 becomes a predetermined logic within the set time range.

As described above, the analyzer 700 according to the seventh embodiment of the present invention monitors the information stored in any one of the scan FFs 703 in the actual operation, stops the actual operation on the basis of the information, and then reads out the information in the internal circuit by the scan test operation. The information in any one of the scan FFs 703 is monitored and then the timing at which the information is changed is used to read the information in the internal circuit, thereby making it possible to analyze a specific spot in the internal circuit at specific time. Furthermore, by the use of the scan paths, the information in specific one of the FFs can be read out in the actual operation without increasing the number of wirings between cells in the analyzer.

The analyzer 700 may not have the determining unit 707, thereby outputting the scan out 706 from a test terminal or the like to the outside.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be applied to a semiconductor integrated circuit including an analyzer having a scan path function, in particular, to a semiconductor integrated circuit having a large-scale logic circuit. The present invention can also be applied to an analyzer for analyzing a failure of a circuit at the design stage of a semiconductor integrated circuit.

What is claimed is:

1. An analyzer having a scan test function, comprising:
scan paths, each including flip-flops which function as a shift register when a scan test is performed;
a switcher operable to switch between a first connection state and a second connection state, wherein in the second connection state said scan paths are connected in series forming a series scan path, and an output from said series scan path at a last stage is connected to an input of said series scan path at a first stage;
an oscillator operable to oscillate a clock used at a time of actual operation;
an oscillation controller operable to stop an oscillation of said oscillator when an operation mode performed by said analyzer is shifted from the actual operation to the scan test; and a clock controller operable to wait for a stabilization of the oscillation of said oscillator and resume a supply of the clock used in the actual operation when an operation mode performed by said analyzer is returned from the scan test to the actual operation.

2. The analyzer according to claim 1,
wherein said switcher is operable to switch between the first connection state and the second connection state, the first connection state being a state in which to an input of each of said scan paths connected is a signal to be written in said series scan path at the time of the scan test.

3. The analyzer according to claim 1, further comprising
a data converter operable to replace predetermined data with the output from said series scan path at the last stage.

4. The analyzer according to claim 3,
wherein said data converter includes a memory operable to store information for specifying each of said flip-flops included in said scan paths, and
said data converter is operable to replace data stored in said flip-flops included in said scan paths based on the information stored in said memory.

5. The analyzer according to claim 1, further comprising:
a memory in which data used at the time of actual operation is stored; and
a memory controller operable to control an operation of said memory independently of a scan operation of said scan paths at the time of the scan test.

6. The analyzer according to claim 1, further comprising:
a first memory in which data used at the time of actual operation is stored; and
a second memory operable to store the data stored by said first memory when the scan test starts.

7. The analyzer according to claim 1,
wherein said scan paths include a first scan path and a second scan path,
said analyzer comprises:
a first functional block including said first scan path; and
a second functional block including said second scan path, and operating asynchronously with said first functional block at the time of actual operation,
wherein said first functional block includes a data transmitter operable to transmit data to said second functional block,
wherein said second functional block includes a data receiver operable to generate an acknowledge signal for notifying said first functional block that the data is received when the data receiver properly receives the data from said data transmitter, and
wherein said data receiver is operable to transmit the acknowledge signal to said first functional block when the operation mode performed by said analyzer is shifted to actual operation and a state of said second functional block turns into a data-receivable state.

8. The analyzer according to claim 1,
wherein said scan paths include a first scan path and a second scan path, and
said analyzer further comprises:
a first functional block including said first scan path, and operating in accordance with a first clock at the time of actual operation;
a second functional block including said second scan path, and operating in accordance with a second clock that is asynchronous with the first clock at the time of the actual operation;
a phase difference detector operable to detect a phase difference between the first clock and the second clock when the actual operation is shifted to the scan test;
a phase difference holder operable to hold the phase difference detected by said phase difference detector; and
a delay controller operable to delay, when the operation mode performed by said analyzer is returned from the scan test to the actual operation, to at least one of the first clock and the second clock, thereby making the phase difference between the first clock and the second clock equal to the phase difference held by said phase difference holder.

9. The analyzer according to claim 1,
wherein said scan paths include a first scan path and a second scan path, and
said analyzer further comprises:
a first functional block including said first scan path and operating in accordance with a first clock at the time of actual operation;
a second functional block including said second scan path and operating in accordance with a second clock that is asynchronous with the first clock at the time of the actual operation;
a first selector operable to select the first clock or a third clock and supply the selected clock to said first functional block; and
a second selector operable to select the second clock or a fourth clock that is synchronous with the third clock and supply the selected clock to said second functional block.

10. The analyzer according to claim 1, further comprising:
an external data acquisitioner operable to acquire data from an external device at the time of actual operation; and
an external device controller operable to stop said external device at a time of the scan test and resume an operation of said external device when the operation mode performed by said analyzer is returned from the scan test to the actual operation.

11. The analyzer according to claim 1, further comprising:
an image data outputter operable to output image data at the time of actual operation, and output the image data when the actual operation ends, as still image data, at a time of the scan test.

12. The analyzer according to claim 11, further comprising
a synchronization controller operable to resume the actual operation in accordance with a timing based on a synchronizing signal for said image data outputter when the operation mode performed by said analyzer is returned from the scan test to the actual operation.

13. The analyzer according to claim 1,
wherein said scan paths are respectively formed in different functional blocks, and
said analyzer further comprises
a mode switcher operable to control the scan test and the actual operation in each of said scan paths independently.

14. The analyzer according to claim 1, further comprising
a detector operable to detect an internal failure at the time of actual operation and to output an interrupt signal for providing a notification of the failure.

15. The analyzer according to claim 1, further comprising
a mode switcher operable to stop the actual operation in accordance with a signal from outside the analyzer and perform the scan test.

16. The analyzer according to claim 1, further comprising
a selecting signal generator operable to generate a selecting signal for selecting a specific one of said flip-flops, wherein when each of said flip-flops is according to the selecting signal, the selected flip-flop outputs data held therein to a flip-flop at a stage immediately after the selected flip-flop by use of a scan path, and when each of said flip-flops is not according to the selecting signal, an unselected flip-flop outputs data outputted from a flip-flop at a stage immediately before the unselected flip-flop to a flip-flop at a stage immediately after the unselected flip-flop.

17. The analyzer according to claim 16, further comprising:
a determiner operable to determine whether or not data outputted from one or more of said scan paths matches predetermined data at the time of actual operation; and
a mode switcher operable to stop the actual operation and perform the scan test when the determiner determines that the data matches the predetermined data.

18. The analyzer according to claim 16,
wherein the selecting signal generated by said selecting signal generator includes a first selecting signal and a second selecting signal, and
each of said flip-flops is selected on the basis of a logical sum of the first selecting signal and the second selecting signal.

19. An analyzer having a scan test function, comprising:
scan paths, each including flip-flops which function as a shift register when a scan test is performed,
a switcher operable to switch between a first connection state and a second connection state, wherein in the second connection state for each scan path, an output from the scan path is connected to an input of the scan path,
a clock controller operable to supply clocks to each of said scan paths, the clocks numbering as many as the number of stages in said flip-flops included in a scan path, during a scan operation in which data in all of said flip-flops included in said scan paths at a time of the scan test is read out,
an oscillator operable to oscillate a clock used at a time of actual operation, and
an oscillation controller operable to stop an oscillation of said oscillator when an operation mode performed by said analyzer is shifted from the actual operation to the scan test,
wherein the clock controller is operable to wait for a stabilization of the oscillation of said oscillator and resume a supply of the clock used in the actual operation when an operation mode performed by said analyzer is returned from the scan test to the actual operation.

20. The analyzer according to claim 19, further comprising a parallel-serial converter operable to convert outputs from said scan paths to a serial signal.

21. The analyzer according to claim 19, further comprising a serial-parallel converter operable to convert a serial signal to parallel signals,
wherein said switcher is operable to switch between the first connection state, which is a first connection state in which the parallel signals converted by said serial-parallel converter are connected to inputs of said scan paths, and the second connection state.

22. A composite analyzer, comprising:
a first analyzer;
a second analyzer; and
an activator operable to activate said first analyzer and said second analyzer at different timings;
wherein said first analyzer has a scan test function, and includes:
first scan paths, each first scan path including flip-flops which function as a shift register when a scan test is performed;
a first switcher operable to switch between a first connection state and a second connection state in said first analyzer, wherein in the second connection state in said first analyzer aid first scan paths are connected in series forming a first series scan path, and an output from said first series scan path at a last stage is connected to an input of said first series scan path at a first stage; and
a detector operable to detect an internal failure at a time of actual operation and output an interrupt signal providing a notification of the failure, and
wherein said second analyzer has a scan test function, and includes:
second scan paths, each second scan path including flip-flops which function as a shift register at a time of the scan test;
a second switcher operable to switch between a first connection state and a second connection state in said second analyzer, wherein in the second connection state in said second analyzer said second scan paths are connected in series forming a second series scan path, and an output from said second series scan path at a last stage is connected to an input of said second series scan path at a first stage; and
a mode switcher operable to stop the actual operation and perform the scan test in accordance with a signal from outside the composite analyzer, and
wherein said mode switcher in said second analyzer is operable to stop the actual operation and perform the scan test in accordance with the interrupt signal outputted from said detector in said first analyzer.

23. The analyzer according to claim 22,
wherein said activator is operable to activate said first analyzer and said second analyzer at different timings, by making a timing of releasing a reset signal for resetting an operation of said first analyzer device different from a timing of releasing a reset signal for resetting an operation of said second analyzer device.

* * * * *